US008374364B2

(12) United States Patent
Kasai et al.

(10) Patent No.: US 8,374,364 B2
(45) Date of Patent: Feb. 12, 2013

(54) ACOUSTIC SENSOR AND METHOD OF MANUFACTURING THE SAME

(75) Inventors: Takashi Kasai, Kusatsu (JP); Yoshitaka Tsurukame, Kusatsu (JP); Seung Kae Moon, Kyotanabe (JP); Shinichi Terasaka, Kusatsu (JP)

(73) Assignee: OMRON Corporation, Kyoto (JP)

( * ) Notice: Subject to any disclaimer, the term of this patent is extended or adjusted under 35 U.S.C. 154(b) by 122 days.

(21) Appl. No.: 13/096,621

(22) Filed: Apr. 28, 2011

(65) Prior Publication Data

US 2011/0266640 A1 Nov. 3, 2011

(30) Foreign Application Priority Data

Apr. 28, 2010 (JP) ................................ 2010-104193

(51) Int. Cl.
*H04R 19/04* (2006.01)
*H01L 21/00* (2006.01)
*H01L 29/84* (2006.01)

(52) U.S. Cl. ........... 381/174; 381/191; 438/53; 257/416

(58) Field of Classification Search .................. 381/174, 381/191; 257/416; 438/53

See application file for complete search history.

(56) References Cited

U.S. PATENT DOCUMENTS

| | | | | |
|---|---|---|---|---|
| 7,804,969 | B2 * | 9/2010 | Wang et al. | 381/174 |
| 8,045,733 | B2 * | 10/2011 | Zhe et al. | 381/174 |
| 8,098,870 | B2 * | 1/2012 | Kok et al. | 381/355 |
| 2009/0136064 | A1 | 5/2009 | Suzuki et al. | |

FOREIGN PATENT DOCUMENTS

JP 2009-089097 A 4/2009

* cited by examiner

*Primary Examiner* — Evan Pert
(74) *Attorney, Agent, or Firm* — Osha Liang LLP

(57) ABSTRACT

An acoustic sensor lengthens the portion of the beam portion not fixed with the anchor without lowering the strength of the beam portion and the supporting strength of the diaphragm. On an upper surface of a silicon substrate, a beam portion made of polysilicon is formed through a second sacrifice layer made of silicon dioxide film on an extended portion of a first sacrifice layer made of polysilicon. The extended portion is formed under a region excluding a distal end of the beam portion. The extended portion is removed by etching from a back chamber arranged in the silicon substrate to form a hollow portion in a region excluding the distal end of the lower surface of the beam portion, and then the second sacrifice layer is removed by etching. The second sacrifice layer remaining on the lower surface of the distal end of the beam portion forms an anchor.

13 Claims, 26 Drawing Sheets

ACOUSTIC SENSOR AND METHOD OF MANUFACTURING THE SAME

BACKGROUND OF THE INVENTION

1. Technical Field

The present invention relates to acoustic sensors and methods for manufacturing the same. Specifically, the present invention relates to an MEMS (Micro Electro Mechanical Systems) type acoustic sensor, and a method for manufacturing the acoustic sensor using the MEMS technique.

2. Related Art

An electret capacitor microphone and an MEMS microphone are used for a miniature microphone, and embodiments of the present invention relate to an acoustic sensor (microphone chip) used in the MEMS microphone manufactured using the MEMS technique. First, the conventional acoustic sensor related to embodiments of the present invention will be described.

(General Acoustic Sensor MEMS Type of Prior Art)

FIG. 1A is a cross-sectional view in a diagonal direction of a conventional acoustic sensor 11 of the MEMS type (cross-sectional view taken along line X-X of FIG. 1B), and FIG. 1B is a plan view in a state a back plate is removed in the acoustic sensor 11. The acoustic sensor 11 is mainly configured by a silicon substrate 12 made of monocrystal silicon, a diaphragm 13 made of polysilicon, and a back plate 14. A back chamber 15 is opened in the silicon substrate 12 to pass therethrough, and the diaphragm 13 is arranged on an upper surface of the silicon substrate 12 so as to cover the upper side of the back chamber 15. The diaphragm 13 has a substantially square shape, where a beam portion 16 extends outward in the diagonal direction from each corner. Each beam portion 16 is fixed to the upper surface of the silicon substrate 12 by an anchor 17 arranged on the lower surface of the beam portion, and the diaphragm 13 floats from the upper surface of the silicon substrate 12 by the anchor 17.

The diaphragm 13 is covered by the back plate 14 fixed on the upper surface of the silicon substrate 12, and a great number of acoustic holes 18 (acoustic perforations) for passing the acoustic vibration is opened in the back plate 14. The back plate 14 includes a fixed electrode film 20 made of polysilicon on an inner surface of a plate portion 19 having high rigidity made of SiN.

The acoustic sensor 11 is manufactured through the manufacturing processes, for example, as shown in FIG. 2A to FIG. 2D (line appearing on the far side of the cross-section is sometimes omitted to facilitate the understanding in the cross-sectional views after FIGS. 2A to 2D) using the MEMS technique. As shown in FIG. 2A, a sacrifice layer 21 ($SiO_2$ layer) is stacked on the upper surface of the silicon substrate 12, a polysilicon thin film is formed thereon, and the polysilicon thin film is etched to a predetermined diaphragm shape to form the diaphragm 13.

The sacrifice layer 21 ($SiO_2$ layer) is further stacked on the diaphragm 12 and the sacrifice layer 21 to cover the diaphragm 13 with the sacrifice layer 21, and then the sacrifice layer 21 is etched in accordance with the inner surface shape of the back plate 14. A polysilicon layer is formed on the sacrifice layer 21, and such polysilicon layer is etched to a predetermined fixed electrode film shape to form the fixed electrode film 20. Thereafter, as shown in FIG. 2B, a SiN layer is stacked on the fixed electrode film 20 and the sacrifice layer 21, and the SiN layer is etched to a predetermined shape to form the plate portion 19. A great number of acoustic holes 18 are opened in the back plate 14 including the plate portion 19 and the fixed electrode film 20.

Subsequently, as shown in FIG. 2C, a central part of the silicon substrate 12 is selectively etched from the lower surface side to pass the back chamber 15 through the silicon substrate 12, so that the sacrifice layer 21 is exposed at the upper surface of the back chamber 15.

Thereafter, the sacrifice layer 21 is subjected to wet etching through the acoustic holes 18 of the back plate 14, the back chamber 15 of the silicon substrate 12, and the like, so that only the sacrifice layer 21 under the beam portion 16 remains as the anchor 17 and the other sacrifice layer 21 is removed, as shown in FIG. 2D. As a result, the diaphragm 13 floats from the upper surface of the silicon substrate 12 by the anchor 17 and is supported to be able to film vibrate on the back chamber 15, whereby an air gap is formed between the fixed electrode film 20 and the diaphragm 13.

In such acoustic sensor 11, the beam portion 16 is extended from the diaphragm 13 and the beam portion 16 is fixed to the silicon substrate 12 by the anchor 17 formed by leaving one part of the sacrifice layer to increase the displacement of the diaphragm 13 due to sound pressure and enhance the sensitivity of the diaphragm 13. In order to further enhance the sensitivity of the diaphragm 13, the beam portion 16 is made longer and the anchor 17 is positioned distant from the edge of the back chamber 15, and the length of the portion of the beam portion 16 not fixed with the anchor 17 is made longer.

However, the sacrifice layer 21 is etched with an etchant infiltrated from the acoustic holes 18 or an etchant introduced from the back chamber 15 as shown with arrows in FIG. 3A, and the anchor 17 is formed by the sacrifice layer 21 left under the beam portion 16 as shown in FIG. 3B. The anchor 17 thus also becomes long if the beam portion 16 is made long, and hence, the length of the portion of the beam portion 16 not fixed with the anchor 17 cannot be increased. Furthermore, the anchor 17 becomes thin and short if the etching time is extended in an attempt to position the anchor 17 distant from the edge of the back chamber 15 because the sacrifice layer 21 under the beam portion 16 also gets etched from the side surface as shown in FIG. 3C, and hence, the beam portion 16 cannot be supported with the anchor 17.

(Acoustic sensor of Japanese Unexamined Patent Publication No. 2009-89097)

The acoustic sensor in which the length of the portion of the beam portion not fixed with the anchor is increased is disclosed in Japanese Unexamined Patent Publication No. 2009-89097. In the acoustic sensor of Japanese Unexamined Patent Publication No. 2009-89097, the length of the portion of the beam portion not fixed with the anchor is increased by opening a plurality of through-holes at the portion of the beam portion not fixed with the anchor, and increasing the area at the end of the beam portion.

FIGS. 4B and 4C are a cross-sectional view and a plan view schematically showing the beam portion 16 formed with a plurality of through-holes 22 at the portion not fixed with the anchor 17. If the through-holes 22 are formed in the beam portion 16, the sacrifice layer 21 at the lower surface of the beam portion 16 will be etched by the etchant infiltrated from the through-holes 22, as shown in FIG. 4A when the sacrifice layer 21 is etched. Therefore, the sacrifice layer 21 remains only at the end where the through-hole 22 is not formed, and the anchor 17 is formed at the end of the beam portion 16, as shown in FIGS. 4B and 4C.

However, if the through-holes 22 are formed in the beam portion 16, the mechanical strength of the beam portion 16 may decrease, and the beam portion 16 may break during a drop test or when a device incorporating the acoustic sensor is dropped.

FIGS. 5A and 5B are a cross-sectional view and a plan view schematically showing the beam portion 16 in which the area at the end 23 is increased. According to such structure, the sacrifice layer remains at the end 23 even after the sacrifice layer is removed in a region other than the end of the beam portion 16, and hence, the anchor 17 can be formed at the end 23 of the diaphragm 13.

In such structure, however, the miniaturization of the acoustic sensor may be inhibited as the area of the beam portion 16 increases. Furthermore, the area of the anchor 17 becomes small compared to the area of the end 23 because the sacrifice layer other than the end 23 needs to be completely removed, and hence, the support of the diaphragm 13 may become unstable.

SUMMARY

Therefore, one or more embodiments of the present invention provides an acoustic sensor capable of increasing the length of the portion of the beam portion not fixed with the anchor without lowering the strength of the beam portion and the supporting strength of the diaphragm.

One or more embodiments of the present invention provides a first manufacturing method of an acoustic sensor, including a semiconductor substrate with a back chamber, a vibration thin film arranged on an upper side of the semiconductor substrate, an anchor arranged on an upper surface of the semiconductor substrate, a beam portion being integrally extended from the vibration thin film and having a distal end supported by the anchor, and a back plate fixed to the upper surface of the semiconductor substrate to cover the vibration thin film and the beam portion with a space, for converting an acoustic vibration detected by the vibration thin film into a change in electrostatic capacitance between a fixed electrode film arranged on the back plate and the vibration thin film, the manufacturing method including the steps of: forming a first sacrifice layer and a second sacrifice layer between a surface of the semiconductor substrate and a lower surface of the vibration thin film and the beam portion, covering an upper surface of the vibration thin film and the beam portion with the second sacrifice layer and arranging the vibration thin film and the beam portion in a sacrifice layer including the first sacrifice layer and the second sacrifice layer; forming the back plate on the sacrifice layer; forming the back chamber in the semiconductor substrate; removing the first sacrifice layer by etching; and removing one part of the second sacrifice layer by etching after removing the first sacrifice layer by etching and forming the anchor between a lower surface of the distal end of the beam portion and the surface of the semiconductor substrate from the remaining second sacrifice layer.

In a first manufacturing method of an acoustic sensor according to one or more embodiments of the present invention, a hollow portion can be formed in a sacrifice layer by removing a first sacrifice layer through etching in advance, so that the etching area of a second sacrifice layer can be controlled by guiding the etchant to an arbitrary position from such hollow portion. Therefore, an anchor can be arranged at the distal end of the beam portion, the region not fixed with the anchor in the beam portion can be made long, and the sensitivity of the acoustic sensor can be enhanced. Furthermore, the strength of the beam portion is not lowered as in the prior art in which a through hole is formed in the beam portion, and the support of the beam portion does not become unstable as in the prior art in which the area of the distal end of the beam portion is large.

In the first manufacturing method of the acoustic sensor according to one or more embodiments of the present invention, the first sacrifice layer is formed in a region excluding the lower surface of the distal end of the beam portion and other than at least the distal end of the beam portion when seen from a direction perpendicular to a surface of the semiconductor substrate. Accordingly, the hollow portion can be formed in the region other than the distal end of the beam portion by removing the first sacrifice layer through etching, so that the anchor can be easily formed at the distal end of the beam portion even if the length of the beam portion is made long.

In the first manufacturing method of the acoustic sensor according to one or more embodiments of the present invention, the first sacrifice layer is formed so as not to be in contact with the vibration thin film and the beam portion. Accordingly, the vibration thin film and the beam portion are not etched when etching the first sacrifice layer. Therefore, the same material used for the vibration thin film and the beam portion can be used for the first sacrifice layer.

In the first manufacturing method of the acoustic sensor according to one or more embodiments of the present invention, the first sacrifice layer is formed so as not to be in contact with the semiconductor substrate. Accordingly, the surface of the semiconductor substrate is not etched when etching the first sacrifice layer, and the characteristics of the acoustic sensor are not lowered.

If the semiconductor substrate is a silicon substrate in the first manufacturing method of the acoustic sensor according to one or more embodiments of the present invention, polysilicon or amorphous silicon is used for the first sacrifice layer. A silicon dioxide film or a silicon nitride film is used for the second sacrifice layer.

In accordance with one or more embodiments of the present invention, there is provided a second manufacturing method of an acoustic sensor, including a semiconductor substrate with a back chamber, a vibration thin film arranged on an upper side of the semiconductor substrate, an anchor arranged on an upper surface of the semiconductor substrate, a beam portion being integrally extended from the vibration thin film and having a distal end supported by the anchor, and a back plate fixed to the upper surface of the semiconductor substrate to cover the vibration thin film and the beam portion with a space, for converting an acoustic vibration detected by the vibration thin film into a change in electrostatic capacitance between a fixed electrode film arranged on the back plate and the vibration thin film, the manufacturing method including the steps of: forming a first sacrifice layer and a second sacrifice layer between a surface of the semiconductor substrate and a lower surface of the vibration thin film and the beam portion to cover at least one of the lower surface of the beam portion or a region facing the beam portion in the semiconductor substrate with the second sacrifice layer, forming an anchor layer between the distal end of the beam portion and the semiconductor substrate separate from the first sacrifice layer with the same material as the first sacrifice layer, covering an upper surface of the vibration thin film and the beam portion with the second sacrifice layer and arranging the vibration thin film and the beam portion in a sacrifice layer including the first sacrifice layer and the second sacrifice layer; forming the back plate on the sacrifice layer; forming the back chamber in the semiconductor substrate; removing the first sacrifice layer by etching; and removing one part of the second sacrifice layer by etching after removing the first sacrifice layer by etching and forming the anchor between a lower surface of the distal end of the beam portion and the surface of the semiconductor substrate from the remaining second sacrifice layer and the anchor layer.

In a second manufacturing method of an acoustic sensor according to one or more embodiments of the present invention, a hollow portion can be formed in a sacrifice layer by removing a first sacrifice layer through etching in advance, so that the etching area of a second sacrifice layer can be controlled by guiding the etchant to an arbitrary position from such hollow portion. Therefore, an anchor can be arranged at the distal end of the beam portion, the region not fixed with the anchor in the beam portion can be made long, and the sensitivity of the acoustic sensor can be enhanced. Furthermore, the anchor layer can be formed at the same time as the first sacrifice layer because it is the same material as the first sacrifice layer, the surface of the second sacrifice layer can be made flat to flatten the beam portion, and the strength of the beam portion can be enhanced. As the height of the anchor increases, the parasitic capacitance in the anchor can be reduced.

In the second manufacturing method of the acoustic sensor according to one or more embodiments of the present invention, the first sacrifice layer is formed in a region excluding the lower surface of the distal end of the beam portion and other than at least the distal end of the beam portion when seen from a direction perpendicular to a surface of the semiconductor substrate. Accordingly, the hollow portion can be formed in the region other than the distal end of the beam portion by removing the first sacrifice layer through etching, so that the anchor can be easily formed at the distal end of the beam portion even if the length of the beam portion is made long.

If the semiconductor substrate is a silicon substrate in the second manufacturing method of the acoustic sensor according to one or more embodiments of the present invention, polysilicon or amorphous silicon is used for the first sacrifice layer. A silicon dioxide film or a silicon nitride film is used for the second sacrifice layer.

In accordance with one or more embodiments of the present invention, there is provided an acoustic sensor including a semiconductor substrate with a back chamber, a vibration thin film arranged on an upper side of the semiconductor substrate, an anchor arranged on an upper surface of the semiconductor substrate, a beam portion being integrally extended from the vibration thin film and having a distal end supported by the anchor, and a back plate fixed to the upper surface of the semiconductor substrate to cover the vibration thin film and the beam portion with a space, for converting an acoustic vibration detected by the vibration thin film into a change in electrostatic capacitance between a fixed electrode film arranged on the back plate and the vibration thin film, wherein the anchor includes a lower anchor layer made from a non-conductive material arranged on the upper surface of the semiconductor substrate, an upper anchor layer made from a non-conductive material arranged on the lower surface of the distal end of the beam portion, and a middle anchor layer which is formed from a material different from the upper anchor layer and the lower anchor layer, and which is sandwiched between the upper anchor layer and the lower anchor layer.

In the acoustic sensor according to one or more embodiments of the present invention, the height of the anchor can be increased because the anchor has a three-layer structure, so that the parasitic capacitance in the anchor can be reduced and lowering in sensitivity of the acoustic sensor by the parasitic capacitance can be alleviated.

If the semiconductor substrate is a silicon substrate in the acoustic sensor according to one or more embodiments of the present invention, polysilicon or amorphous silicon is used for the first sacrifice layer. A silicon dioxide film or a silicon nitride film is used for the second sacrifice layer.

BRIEF DESCRIPTION OF THE DRAWINGS

FIG. 15C shows a cross-section taken along line Y-Y of FIG. 15B;

FIG. 16C shows a cross-section taken along line Y-Y of FIG. 15B;

DETAILED DESCRIPTION

Hereinafter, embodiments of the present invention will be described with reference to the accompanied drawings. It should be recognized that the present invention is not limited to the following embodiments, and various design changes can be made within a scope not deviating from the gist of the invention. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

(Structure of First Embodiment)

A structure and a manufacturing method of an acoustic sensor 31 according to a first embodiment of the present invention will be described with reference to FIG. 6 to FIG. 16.

Figure 1A:
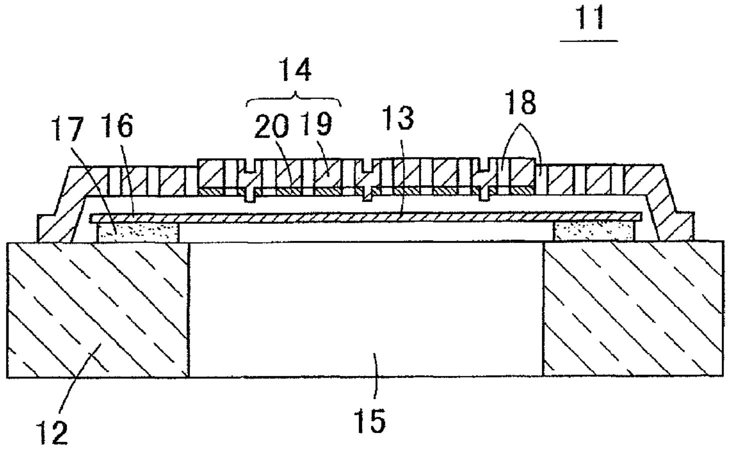
FIG. 1A is a cross-sectional view of a conventional acoustic sensor.
Figure 1B:
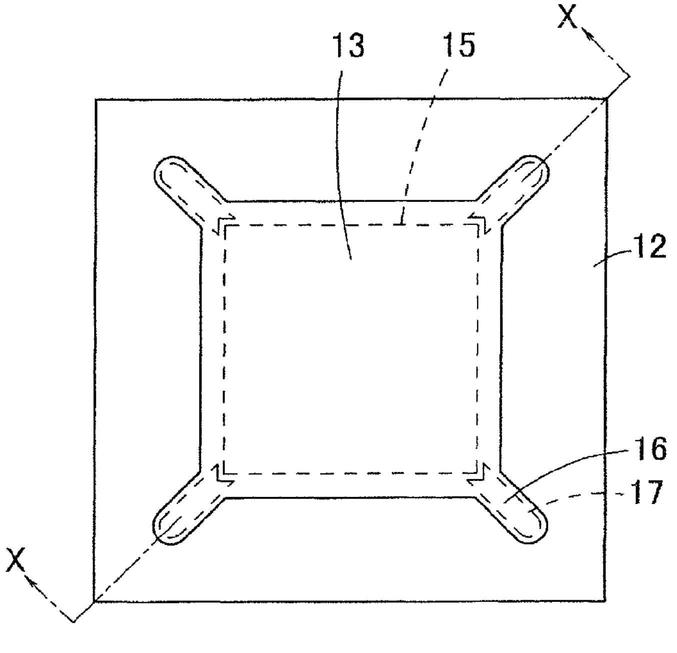
FIG. 1B is a plan view in a state in which a back plate is removed in the conventional acoustic sensor.
Figure 2A:
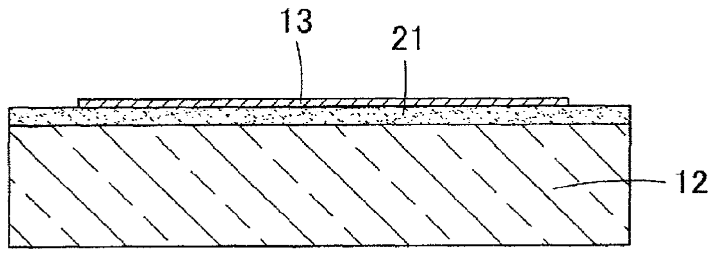
FIGS. 2A to 2D are cross-sectional views showing one example of a method for manufacturing the conventional acoustic sensor.
Figure 2B:
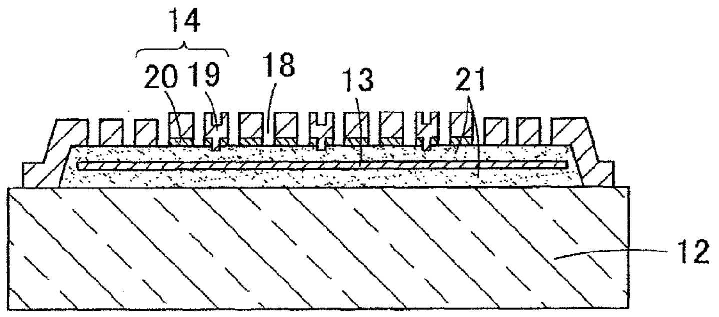
Figure 2C:
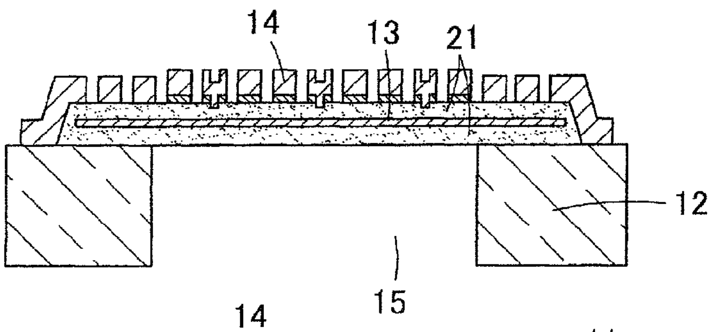
Figure 2D:
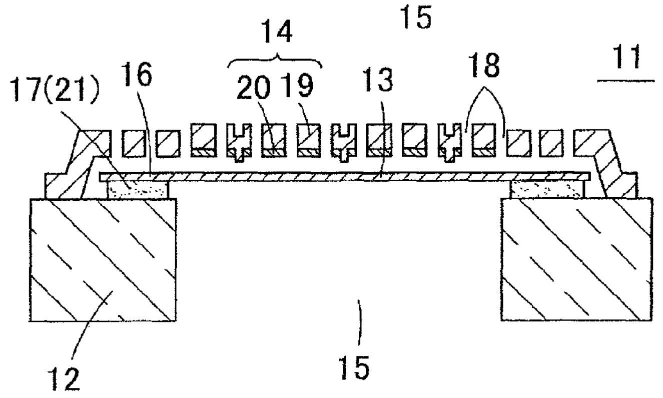
Figure 3A:
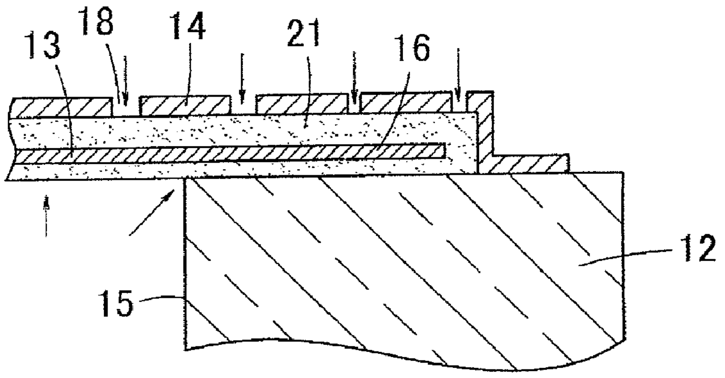
FIGS. 3A and 3B are schematic views describing a state in which an anchor is formed under the beam portion of the diaphragm in the manufacturing method of FIGS. 2A to 2D.
Figure 3B:
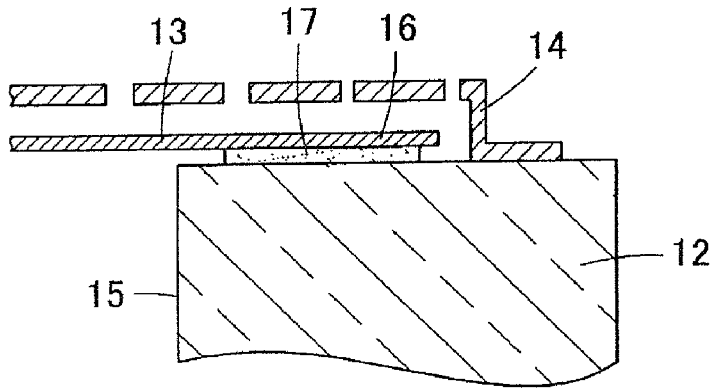
Figure 3C:
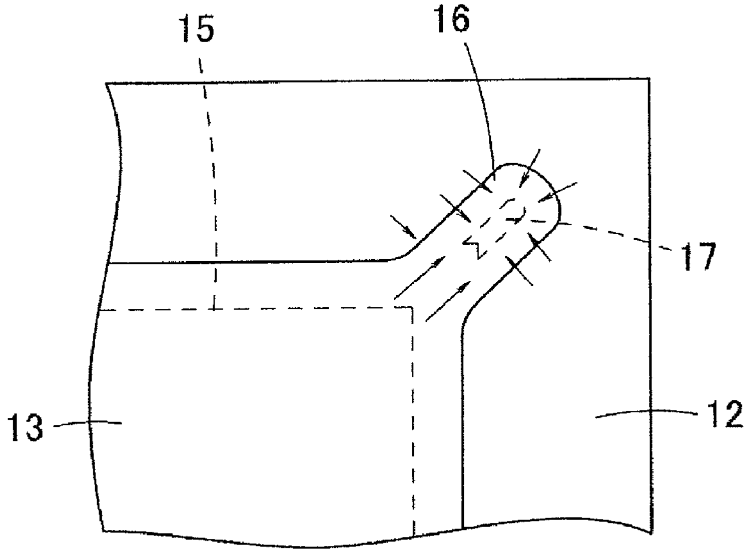
FIG. 3C is a plan view showing a state in which the etching time of the sacrifice layer is extended to reduce the anchor.
Figure 4A:
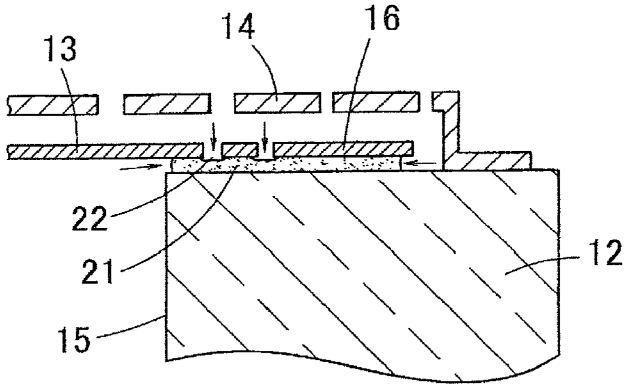
FIG. 4A is a schematic view describing a state in which an anchor is formed under the beam portion formed with through-holes in an acoustic sensor disclosed in Japanese Unexamined Patent Publication No. 2009-89097.
Figure 4B:
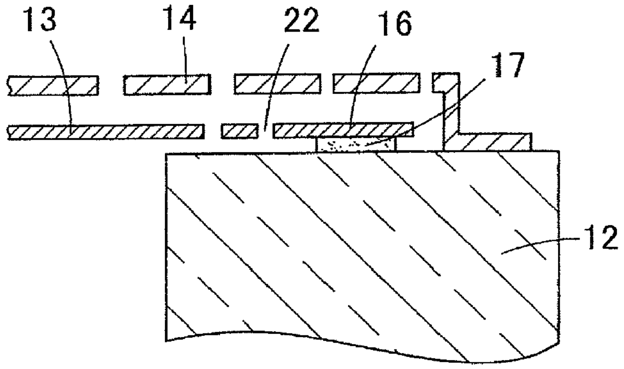
FIGS. 4B and 4C are a cross-sectional view and a plan view showing the beam portion formed by the relevant method.
Figure 4C:
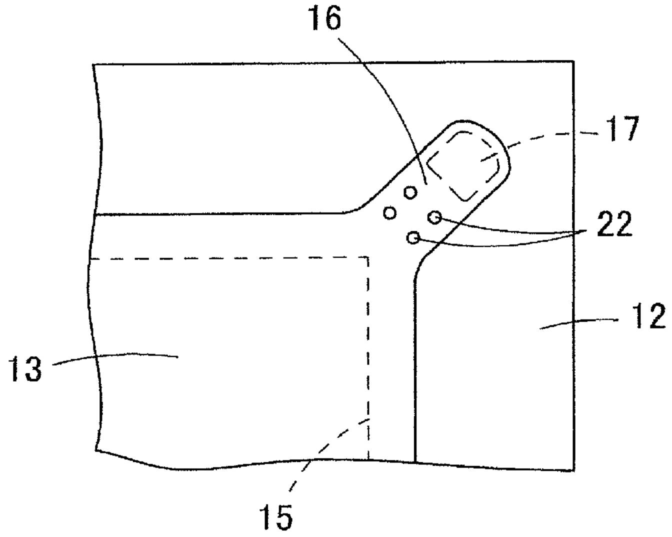
Figure 5A:
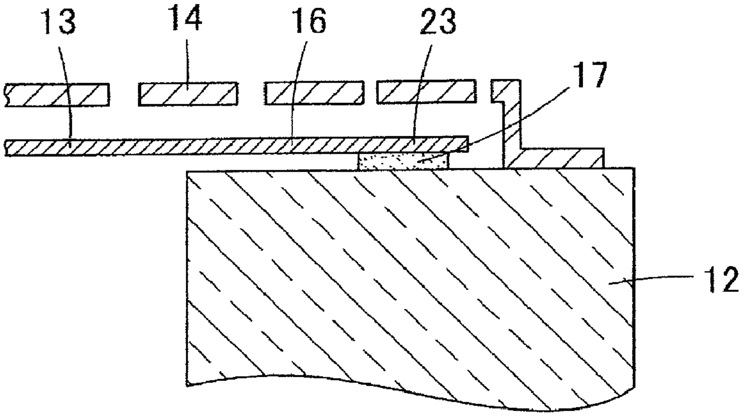
FIGS. 5A and 5B are a cross-sectional view and a plan view showing the beam portion in which the end is enlarged in the acoustic sensor disclosed in Japanese Unexamined Patent Publication No. 2009-89097.
Figure 5B:
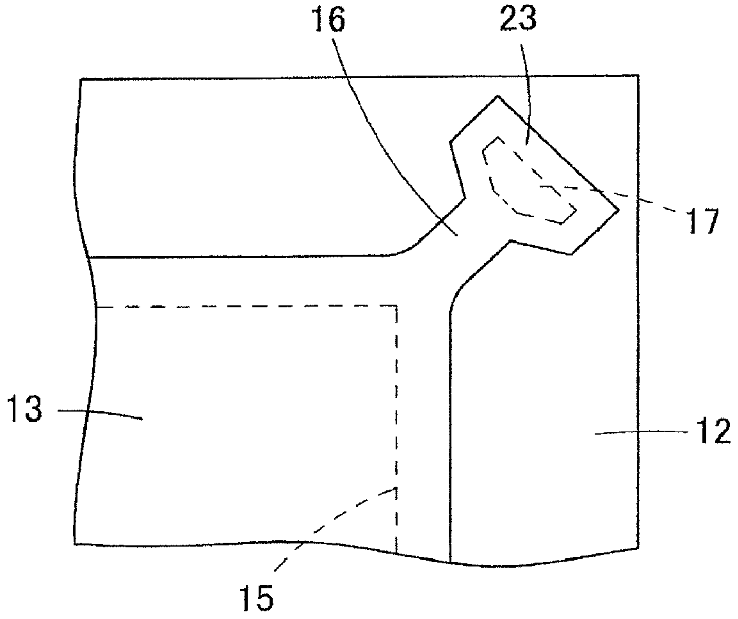
Figure 6:
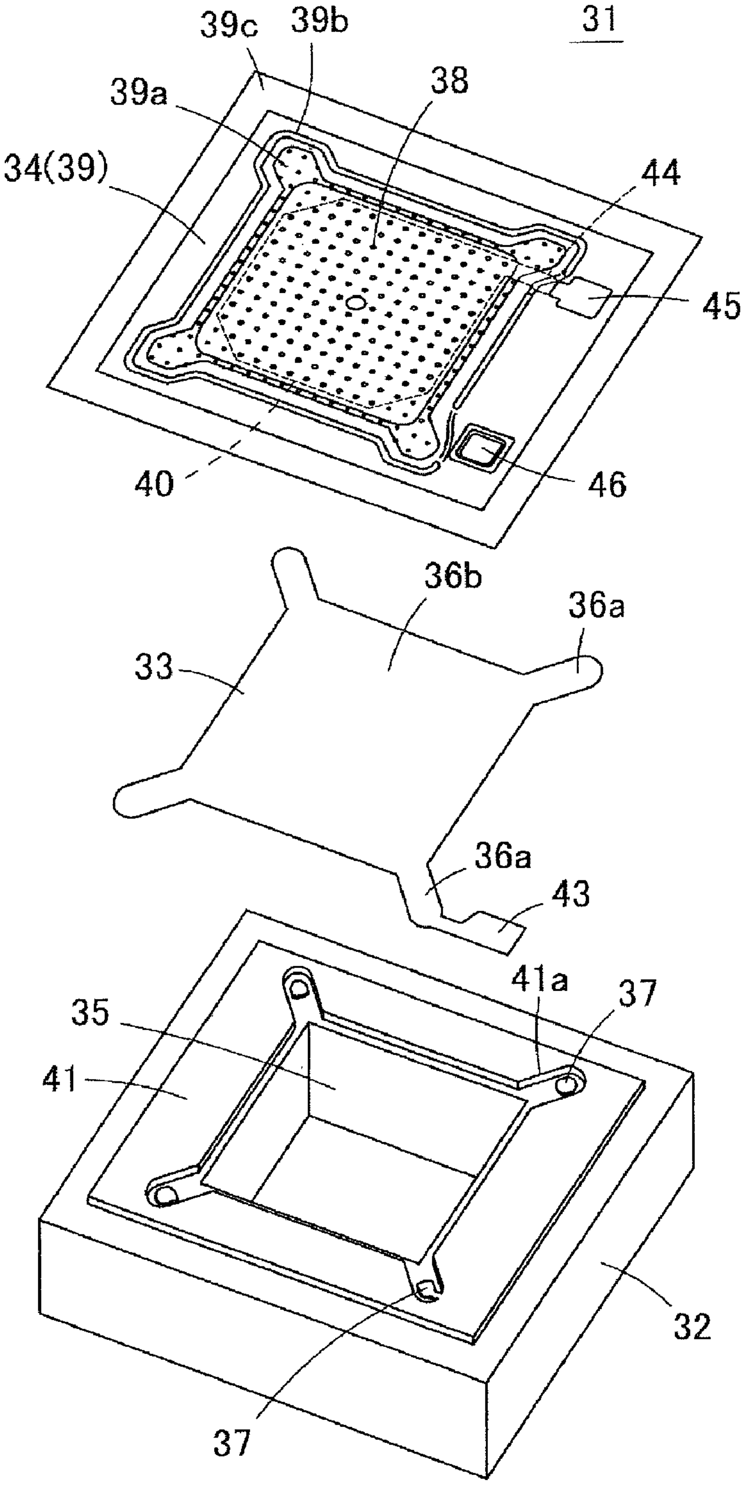
FIG. 6 is a perspective view showing an acoustic sensor of a first embodiment of the present invention in a partially exploded manner.
Figure 7:
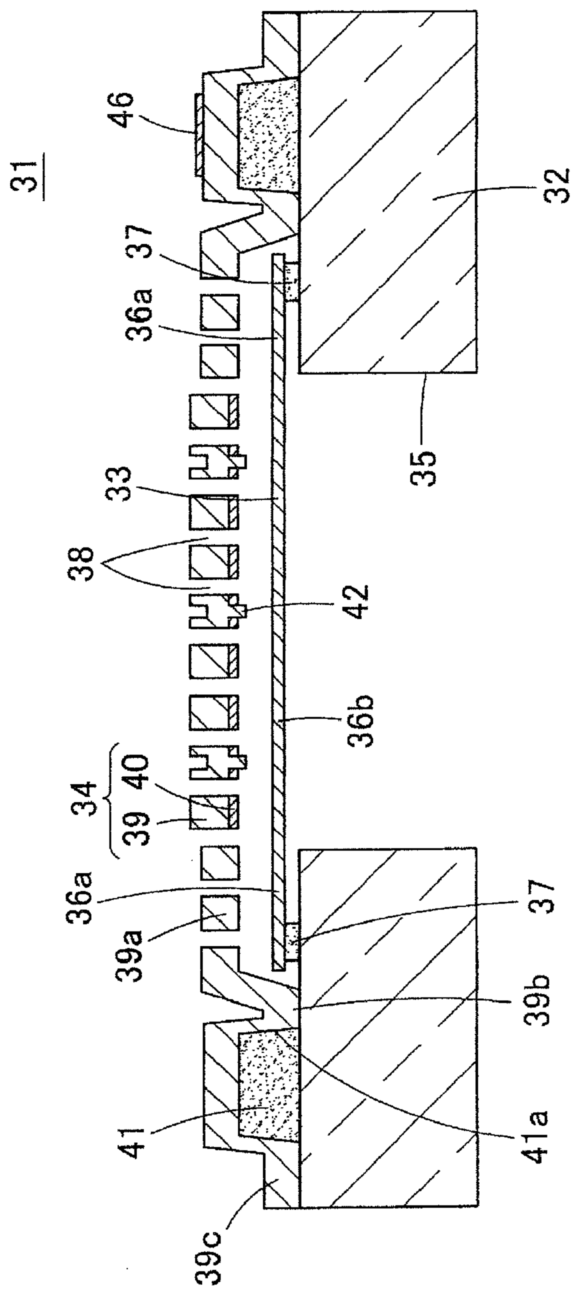
FIG. 7 is a cross-sectional view in the diagonal direction of the acoustic sensor of the first embodiment.
Figure 8:
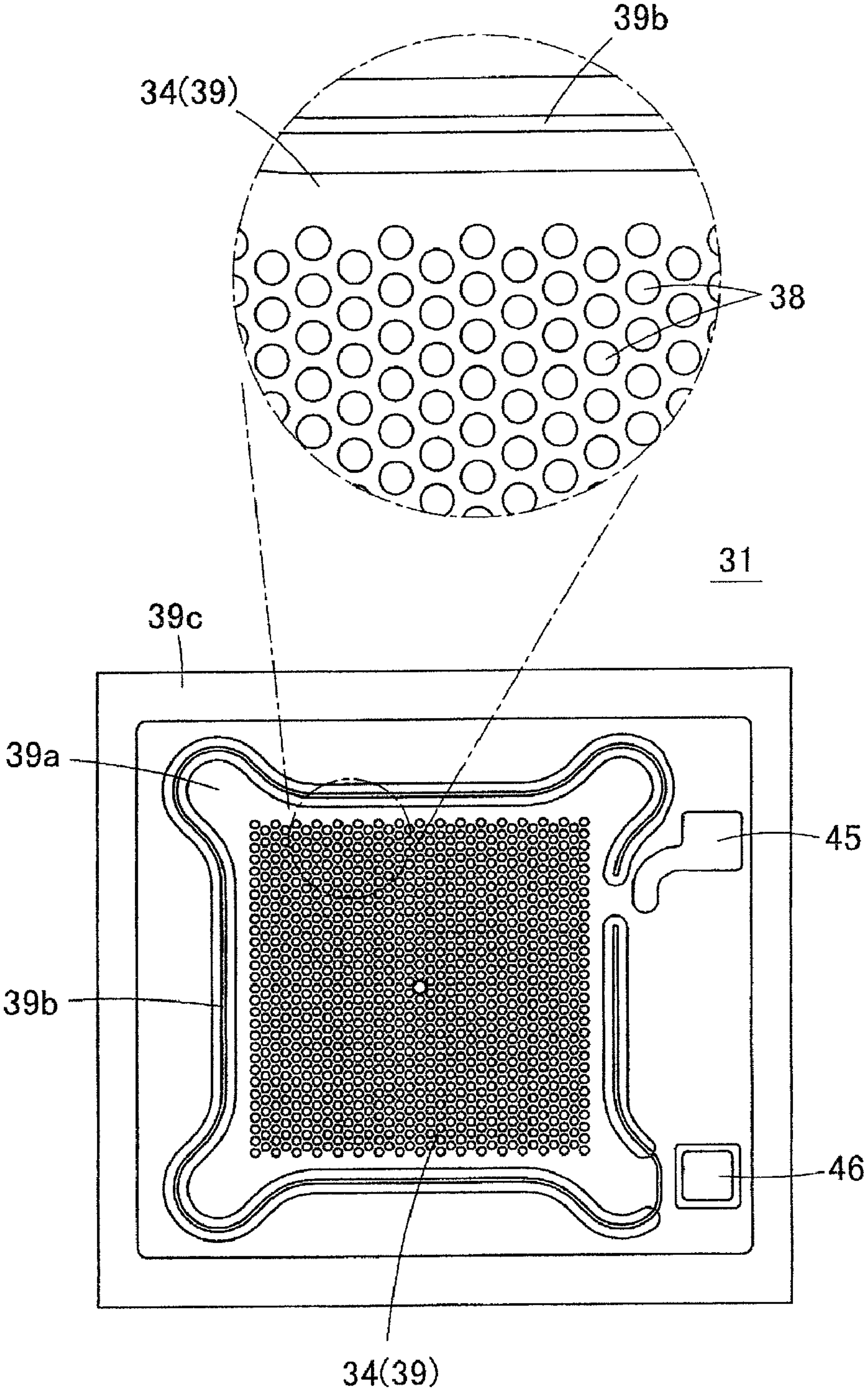
FIG. 8 is a plan view showing a specific mode of the acoustic sensor of the first embodiment, and also shows one part thereof in an enlarged manner.
Figure 9A:
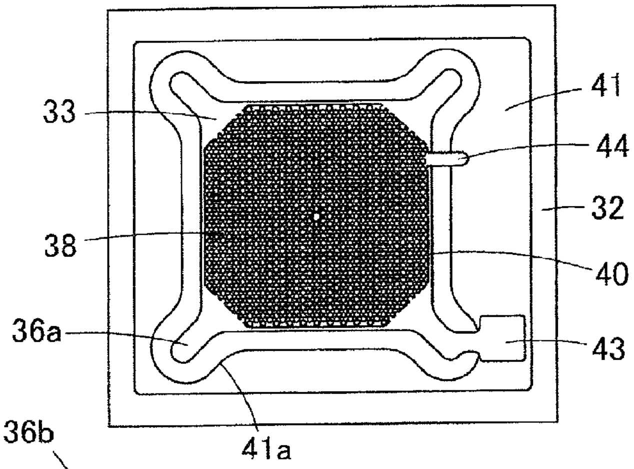
FIG. 9A is a plan view of a state in which a plate portion of the acoustic sensor is removed.
Figure 9B:
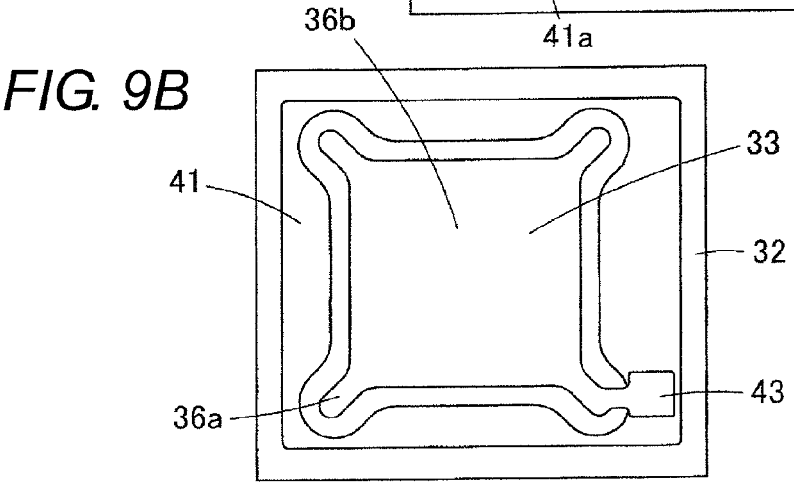
FIG. 9B is a plan view of a state in which a back plate of the acoustic sensor is removed.
Figure 9C:
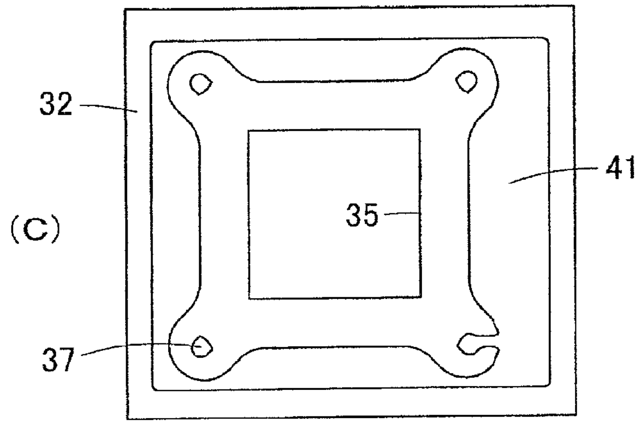
FIG. 9C is a plan view of a state in which the back plate and a diaphragm of the acoustic sensor are removed.

First, the structure of the acoustic sensor 31 of the first embodiment according to the present invention will be described. FIG. 6 is a perspective view showing the acoustic sensor 31 in a partially exploded manner. FIG. 7 is a cross-sectional view in the diagonal direction showing the structure of the acoustic sensor 31. FIG. 8 is a plan view showing a more specific and detailed mode of the acoustic sensor 31. FIG. 9A is a plan view of a state in which a plate portion 39 is removed in FIG. 8. FIG. 9B is a plan view of a state in which a back plate 34 is removed in FIG. 8. FIG. 9C is a plan view of a state in which the back plate 34 and a diaphragm 33 are removed in FIG. 8.

The acoustic sensor 31 is a microscopic capacitance type element manufactured using the MEMS technique, where a diaphragm 33 is arranged on the upper surface of a silicon substrate 32 through an anchor 37, and a back plate 34 is arranged thereon through a microscopic gap (cavity), as shown in FIG. 7.

The silicon substrate 32 is made of a monocrystal silicon. As shown in FIG. 6, the silicon substrate 32 is formed to a rectangular shape, and includes a back chamber 35 having a square hole shape that passes from the front surface to the back surface. The inner peripheral surface of the back chamber 35 may be a perpendicular surface or may be inclined to a tapered form. Although not illustrated, the opening at the lower surface of the back chamber 35 is normally blocked by a package, and the like when the acoustic sensor 31 is mounted in the package.

Four anchors 37 for supporting the beam portion 36*a* of the diaphragm 33 from the lower surface are arranged on the upper surface of the silicon substrate 32, and a base part 41 is formed to surround the back chamber 35 and the anchor 37. In particular, the anchor 37 is positioned within a recessed area 41*a* formed by cutting the inner peripheral edge of the base part 41 in the diagonal direction of the back chamber 35. The anchor 37 and the base part 41 are made from an insulating material such as $SiO_2$.

The diaphragm 33 is formed by a polysilicon thin film having a film thickness of about 0.7 μm, and has conductivity. The diaphragm 33 has the beam portion 36*a* extended outward in the diagonal direction from four corners of a square vibration thin film 36*b*. An extraction wiring 43 is extended from one of the beam portions 36*a*.

As shown in FIG. 7, the diaphragm 33 is arranged on the upper surface of the silicon substrate 32 so that the vibration thin film 36*b* covers the upper surface of the back chamber 35. Each beam portion 36*a* of the diaphragm 33 is positioned in the recessed area 41*a*, and the lower surface of the distal end of each beam portion 36*a* is fixed to the anchor 37. Therefore, the vibration thin film 36*b* of the diaphragm 33 floats in the air at the upper side of the back chamber 35, and film vibrates in response to the acoustic vibration (air vibration).

The back plate 34 is formed by arranging a fixed electrode film 40 made of polysilicon on the lower surface of the plate portion 39 made of nitride film (SiN). The back plate 34 covers the diaphragm 33 through a microscopic gap of about 3 to 4 μm in a region facing the diaphragm 33. A beam portion cover region 39*a* arranged at the corner of the plate portion 39 covers the beam portion 36*a*. The fixed electrode film 40 faces the vibration thin film 36*b* or the movable electrode film and configures a capacitor.

The back plate 34 (plate portion 39 and fixed electrode film 40) has a great number of acoustic holes 38 for passing the acoustic vibration perforated so as to pass from the upper surface to the lower surface (the acoustic hole of the plate portion 39 and the acoustic hole of the fixed electrode film 40 are denoted with the same reference number). A small gap is also formed between the lower surface at the outer peripheral part of the vibration thin film 36*b* and the upper surface of the silicon substrate 32. Therefore, the acoustic vibration that entered the back plate 34 through the acoustic hole 38 vibrates the vibration thin film 36*b*, and also exits to the back chamber 35 through the gap between the outer peripheral part of the vibration thin film 36*b* and the silicon substrate 32.

A great number of microscopic stoppers 42 is projected out at the inner surface of the back plate 34 to prevent the diaphragm 33 from being adsorbed or attached (stuck) to the lower surface of the back plate 34.

The base plate 41 formed on the upper surface of the silicon substrate 32 has a height (thickness) substantially equal to the height of the space in the back plate 34. An inner side adhesive region 39*b* of the plate portion 39 is adhered to the upper surface of the silicon substrate 32 at the inner peripheral part of the base part 41, and an outer side adhesive region 39*c* of the plate portion 39 is adhered to the upper surface of the silicon substrate 32 at the outer peripheral part of the base part 41, so that the base part 41 is enclosed and sealed between the plate portion 39 and the upper surface of the silicon substrate 32.

As shown in FIG. 9A and FIG. 9B, the extraction wiring 43 is fixed to the upper surface of the base part 41, and an extraction wiring 44 extended from the fixed electrode film 40 is also fixed to the upper surface of the base part 41. As shown in FIG. 8, an opening is formed in the plate portion 39 between the inner side adhesive region 39*b* and the outer side adhesive region 39*c*, where a movable side pad 46 (Au film) is formed on the upper surface of the extraction wiring 43 through the relevant opening, through which movable side pad 46 is conducted to the extraction wiring 43 (therefore to the diaphragm 33). The fixed side pad 45 arranged on the upper surface of the plate portion 39 is conducted to the extraction wiring 44 (therefore to the fixed electrode film 40) through a through-hole and the like.

In such acoustic sensor 31, the diaphragm 33, which is a thin film, resonates by the acoustic vibration and the film vibrates when the acoustic vibration passes through the acoustic hole 38 and enters the space between the back plate 34 and the diaphragm 33. When the diaphragm 33 vibrates and the gap distance between the diaphragm 33 and the fixed electrode film 40 changes, the electrostatic capacitance between the diaphragm 33 and the fixed electrode film 40 changes. As a result, in such acoustic sensor 31, the acoustic vibration (change in sound pressure) sensed by the diaphragm 33 becomes the change in electrostatic capacitance between the diaphragm 33 and the fixed electrode film 40, and is output as an electrical signal.

Furthermore, in such acoustic sensor 31, the beam portion 36*a* is extended from four corners of the diaphragm 33, where the distal end of the beam portion 36*a* is fixed with the anchor 37 and the length of the region not fixed with the anchor 37 in the beam portion 36*a* is longer. Thus, the diaphragm 33 easily vibrates and the acoustic sensor 31 can have higher sensitivity.

(Manufacturing Method of First Embodiment)

Figure 13A:
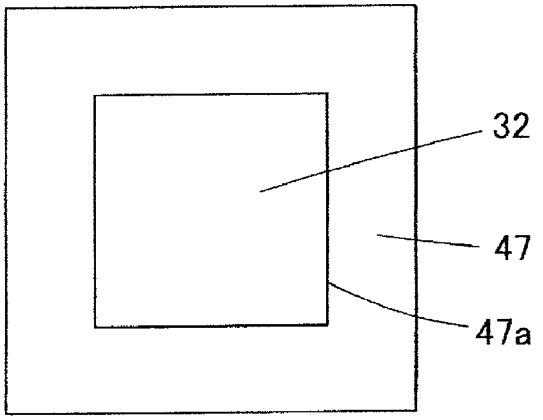
FIG. 13A is a schematic plan view in the process of FIG. 10A.
Figure 13B:
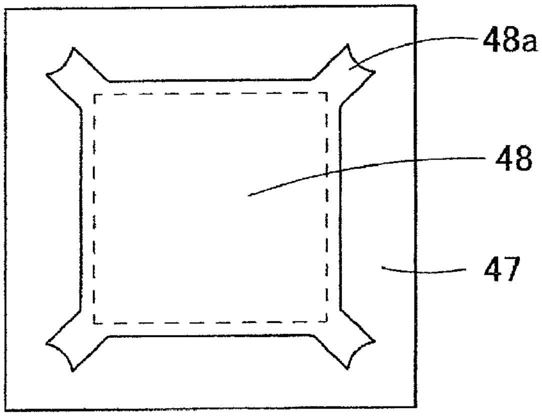
FIG. 13B is a schematic plan view in the process of FIG. 10B.
Figure 13C:
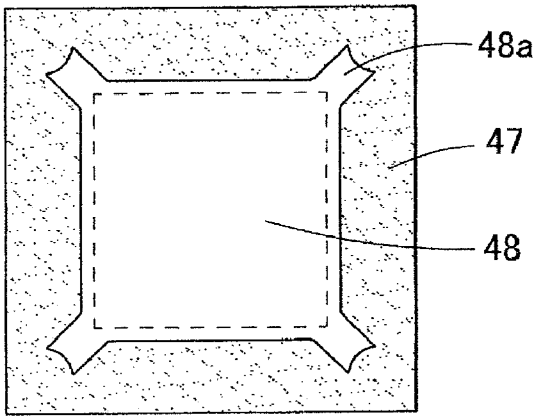
FIG. 13C is a schematic cross-sectional view in the process of FIG. 10C.
Figure 14A:
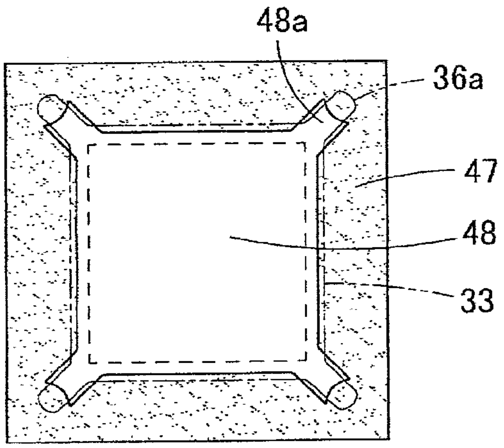
FIG. 14A is a schematic cross-sectional view in the process of FIG. 10D.
Figure 14B:
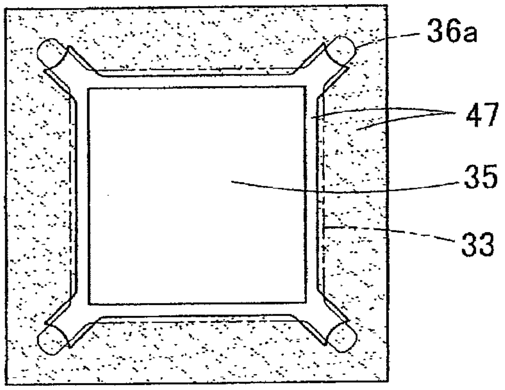
FIG. 14B is a schematic cross-sectional view in the process of FIG. 12B.
Figure 14C:
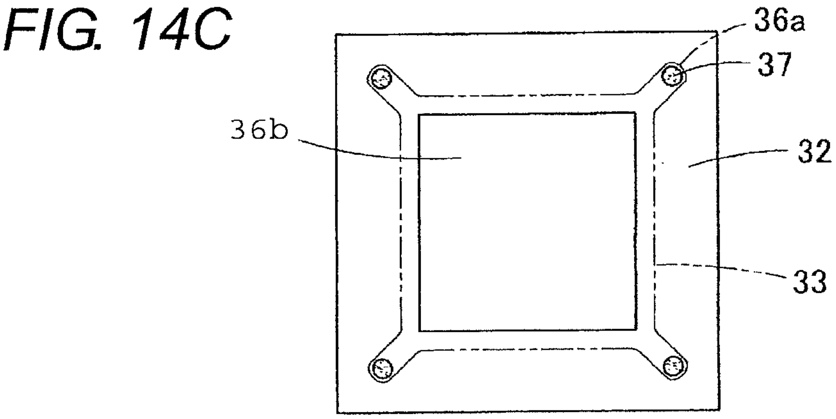
FIG. 14C is a schematic cross-sectional view in the process of FIG. 12C.

A method of increasing the length of the region not fixed with the anchor 37 in the beam portion 36*a* in the acoustic sensor 31 will now be described with the manufacturing method using the MEMS technique of the acoustic sensor 31. FIGS. 10A to 10D, FIGS. 11A to 11C, and FIGS. 12A to 12C are schematic cross-sectional views showing an overall flow of the manufacturing process of the acoustic sensor 31. FIG. 13A is a schematic plan view of FIG. 10A. FIG. 13B is a schematic plan view of FIG. 10B. FIG. 13C is a schematic horizontal cross-sectional view of FIG. 100. FIG. 14A is a schematic horizontal cross-sectional view of FIG. 10D. FIG. 14B is a schematic horizontal cross-sectional view of FIG. 12B. FIG. 14C is a schematic horizontal cross-sectional view of FIG. 12C. FIG. 13C and FIGS. 14A to 14C are all cross-sectional views at the same height, and show the horizontal cross-section along the surface of a first sacrifice layer 48 or at a height of the surface of the first sacrifice layer 48. FIGS. 15A to 15C, and FIGS. 16A to 16C show a state in which the anchor is formed.

Figure 10A:
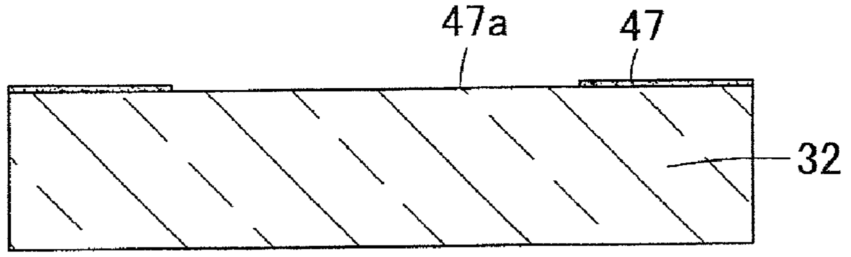
FIGS. 10A to 10D are schematic cross-sectional views describing the manufacturing process of the acoustic sensor of the first embodiment.

First, as shown in FIG. 10A and FIG. 13A, a second sacrifice layer 47 made of silicon dioxide film ($SiO_2$) or silicon nitride film (SiN) is formed through thermal oxidation, CVD method and the like on the surface of the monocrystal silicon substrate 32, and a rectangular opening 47*a* is formed in the second sacrifice layer 47 to expose the surface of the silicon substrate 32 from the opening 47*a*. The opening 47*a* has a dimension equal to or slightly smaller than the opening at the upper surface of the back chamber 35.

Figure 10B:
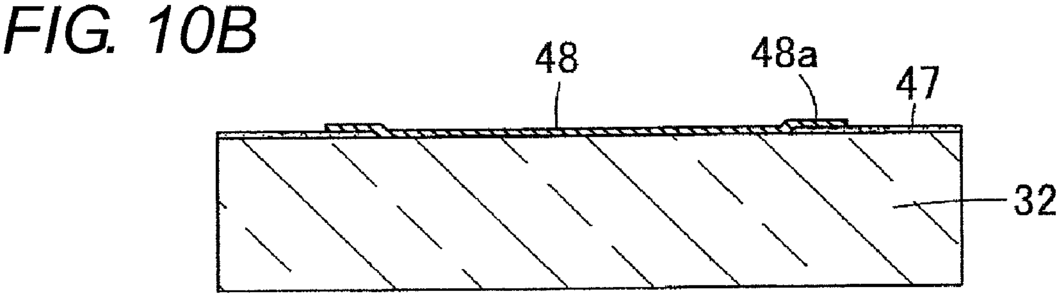
Figure 10C:
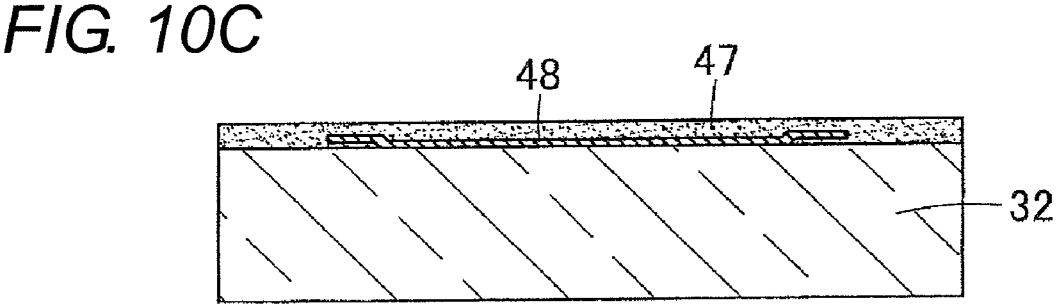

Polysilicon or amorphous silicon is deposited on the silicon substrate 32 from above the second sacrifice layer 47 to form a first sacrifice layer 48, and then the first sacrifice layer 48 is etched for patterning as shown in FIG. 10B and FIG. 13B. As a result, the first sacrifice layer 48 covers the entire silicon substrate 32 in the opening 47*a* and also covers the opening edge of the second sacrifice layer 47, and is also formed with an extended portion 48*a* on the second sacrifice layer 47 in the diagonal direction. As shown in FIG. 100 and FIG. 13C, the second sacrifice layer 47 made of $SiO_2$ is again deposited over the entire upper surface of the silicon substrate 32 from above to sandwich the first sacrifice layer 48 between the second sacrifice layers 47.

Figure 10D:
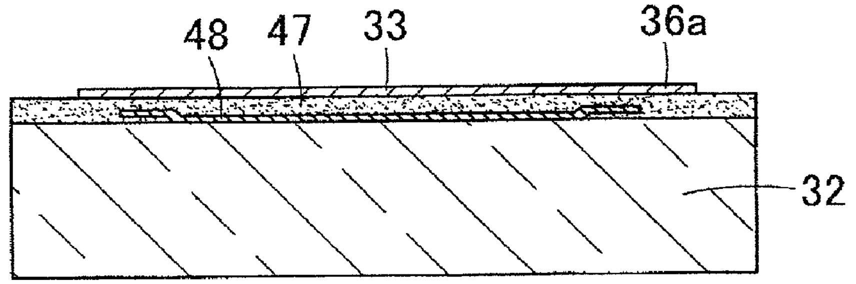

Subsequently, a polysilicon layer is formed on the second sacrifice layer 47, which polysilicon layer is then patterned by etching to form the diaphragm 33 as shown in FIG. 10D and FIG. 14A. In this case, the beam portion 36*a* of the diaphragm 33 overlaps the extended portion 48*a* of the first sacrifice layer 48, and the distal end of the beam portion 36*a* extends longer than the extended portion 48*a*.

If the extended portion 48*a* creates a step difference at the surface of the second sacrifice layer 47 thereon to influence the properties and the strength, the diaphragm 33 may be formed after polishing the surface of the second sacrifice layer 47 through chemical mechanical polishing method (CMP method) and the like to make the surface of the second sacrifice layer 47 flat.

Figure 11A:
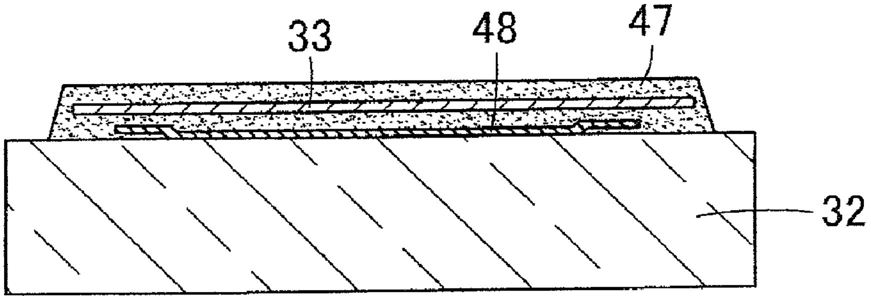
FIGS. 11A to 11C are schematic cross-sectional views describing the manufacturing process of the acoustic sensor of the first embodiment, showing the process following FIG. 10D.
Figure 11B:
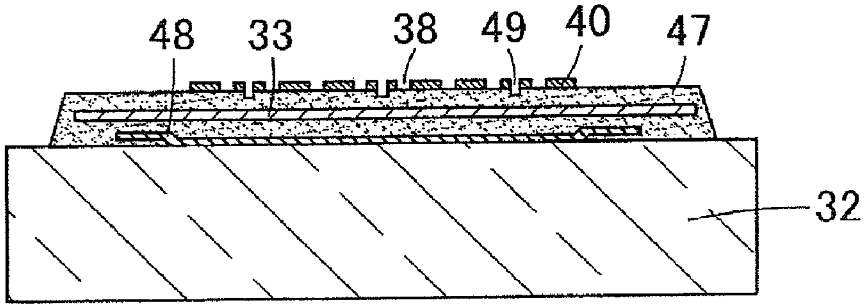

The second sacrifice layer 47 is further deposited on the upper side of the silicon substrate 32 from above the diaphragm 33 to cover the diaphragm 33 with the second sacrifice layer 47, and the second sacrifice layer 47 is etched to form the inner surface shape of the back plate 34 with the second sacrifice layer 47, as shown in FIG. 11A. A polysilicon film is formed on the upper surface of the second sacrifice layer 47, and such polysilicon film is patterned by etching to form the fixed electrode film 40, as shown in FIG. 11B. In this case, the acoustic holes 38 are opened in the fixed electrode film 40, and a hole 49 is dug from the fixed electrode film 40 towards the upper layer part of the second sacrifice layer 47.

Figure 11C:
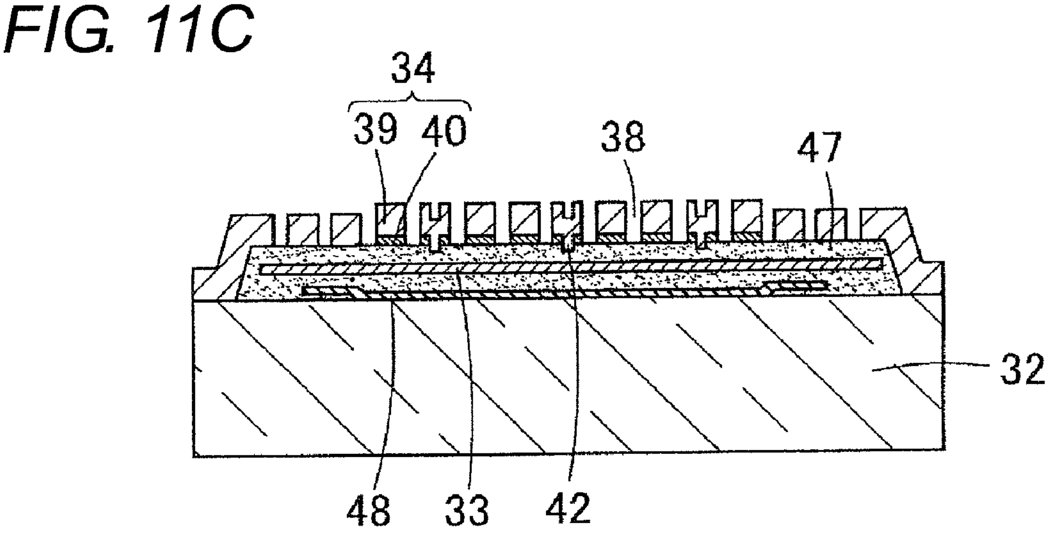

Thereafter, the SiN layer is deposited from above the fixed electrode film 40 to form the plate portion 39, as shown in FIG. 11C. In this case, the stopper 42 for preventing fixed attachment is formed by the SiN layer deposited in the hole 49. The acoustic holes 38 are also formed in the plate portion 39 in alignment with the acoustic holes 38 of the fixed electrode film 40 to pass the acoustic holes 38 through the back plate 34.

Figure 12A:
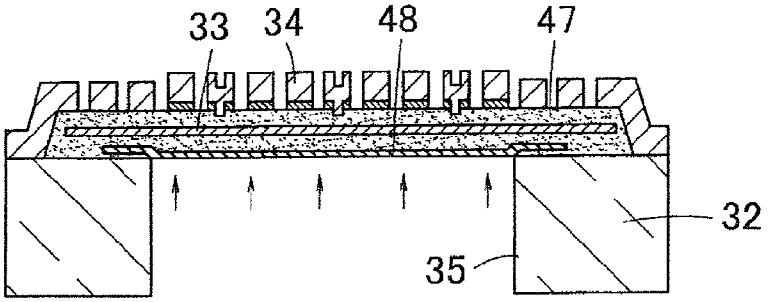
FIGS. 12A to 12C are schematic cross-sectional views describing the manufacturing process of the acoustic sensor of the first embodiment, showing the process following FIG. 11C.

After the formation of the back plate 34 is completed in such manner, the central part of the silicon substrate 32 is bored from the lower surface side to pass the back chamber 35 in the silicon substrate 32, and expose the first sacrifice layer 48 at the upper surface of the back chamber 35, as shown in FIG. 12A. The so-called DRIE method and the like can be applied for the method of boring the silicon substrate 32.

Figure 12B:
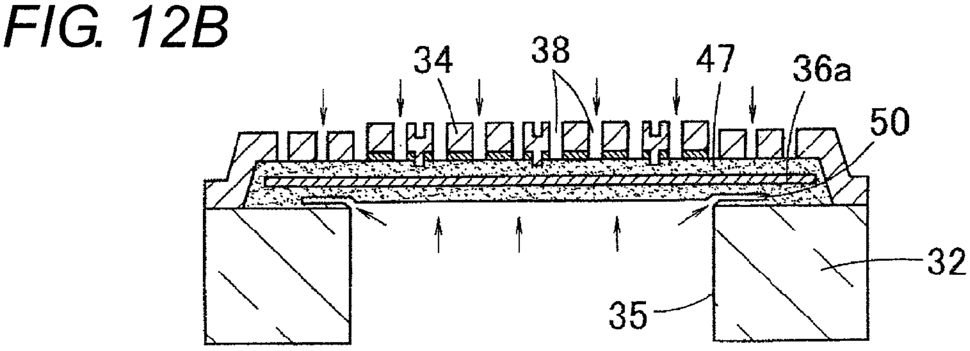

Then, as shown in FIG. 12B and FIG. 14B, the first sacrifice layer 48 is selectively wet etched with the etchant introduced from the back chamber 35 to remove the first sacrifice layer 48. A hollow portion 50 forms on the upper side of the silicon substrate 32 in the trace after the first sacrifice layer 48 is removed by etching. The etchant used to etch the first sacrifice layer 48 is an etchant to which the second sacrifice layer 47 has etching resistance property.

Figure 15A:
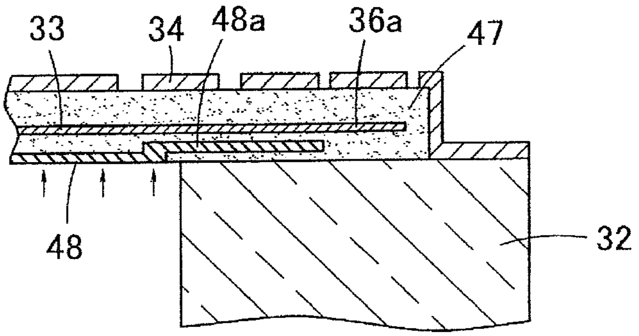
FIGS. 15A to 15C are views specifically describing the steps of forming a hollow portion under the beam portion by etching the first sacrifice layer, where
Figure 15B:
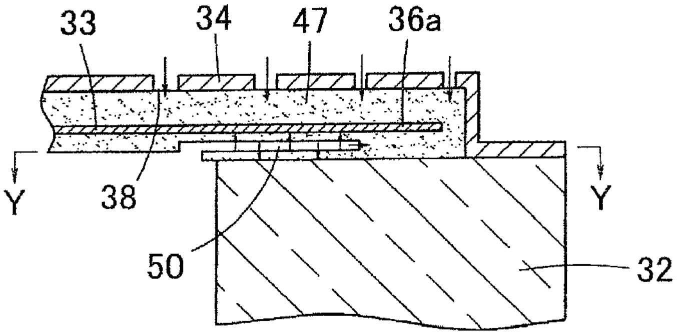

As shown in FIG. 15A, the first sacrifice layer 48 and the diaphragm 33 do not contact because the second sacrifice layer 47 is formed between the upper surface of the first sacrifice layer 48 and the lower surface of the diaphragm 33, and thus, the diaphragm 33 will not be etched when removing the first sacrifice layer 48 by etching. Furthermore, as shown in FIG. 15A, the surface of the silicon substrate 32 is covered with the second sacrifice layer 47 and the first sacrifice layer 48 and the silicon substrate 32 do not contact in the back plate 34, and thus, the surface of the silicon substrate 32 is covered with the second sacrifice layer 47 and is not exposed even if the first sacrifice layer 48 is removed by etching, as shown in FIG. 15B. Therefore, the upper surface of the silicon substrate 32 will not be affected or roughened by the etchant when removing the first sacrifice layer 48 by etching, and the properties of the acoustic sensor 31 can be satisfactorily maintained. In this case, the side surface of the back chamber 35 may be covered with a protective film so as not to be etched. For instance, the side surface of the back chamber 35 can be protected by leaving the protective film applied to the side surface when forming the back chamber 35 with the DRIE method while etching the first sacrifice layer 48. If the diaphragm 33 and the first sacrifice layer 48 are formed from different materials so that the diaphragm 33 is not affected by the etchant when etching the first sacrifice layer 48 and the surface of the silicon substrate 32 is also not affected or roughened by the etchant, the first sacrifice layer 48 may be formed over the entire thickness between the diaphragm 33 and the surface of the silicon substrate 32 in a region other than the distal end of the beam portion 36*a*.

Figure 12C:
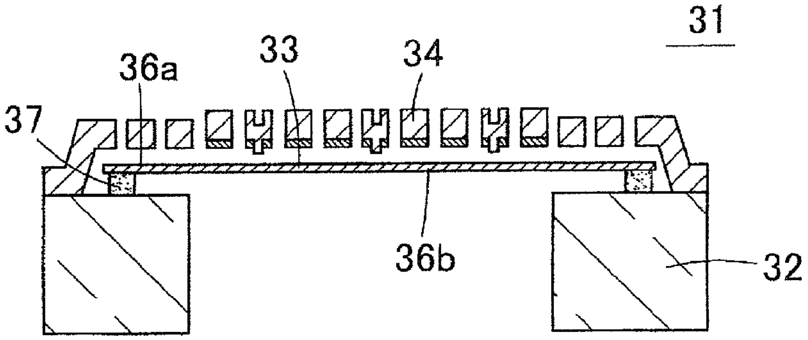

Thereafter, the etchant such as hydrofluoric acid is introduced from the acoustic hole 38 of the back plate 34, the back chamber 35 of the silicon substrate 32, and the like to selectively wet etch the second sacrifice layer 47, and the second sacrifice layer 47 is removed leaving only the second sacrifice layer 47 under the beam portion 36*a* for the anchor 37 as shown in FIG. 12C and FIG. 14C. As a result, the diaphragm 33 floats from the upper surface of the silicon substrate 32 by the anchor 37 and is supported above the back chamber 35 in such manner that it can be vibrated, whereby the air gap forms between the fixed electrode film 40 and the diaphragm 33.

Figure 15C:
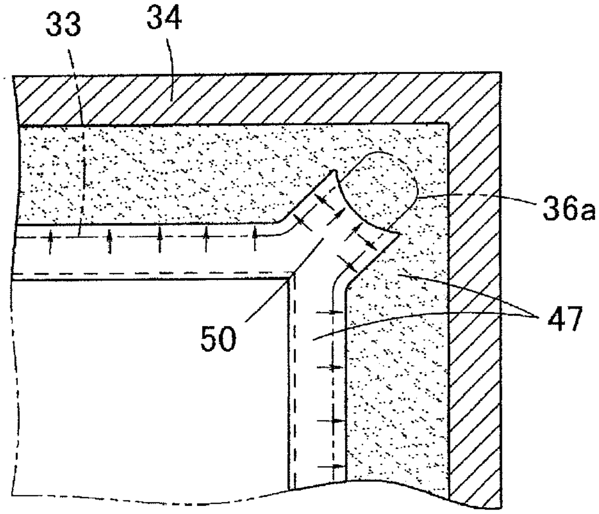
Figure 16A:
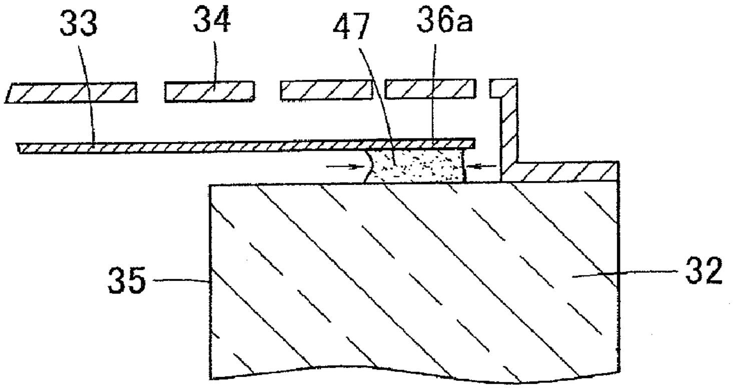
FIGS. 16A to 16C are views specifically describing the steps of forming an anchor under the beam portion by etching the second sacrifice layer, where
Figure 16B:
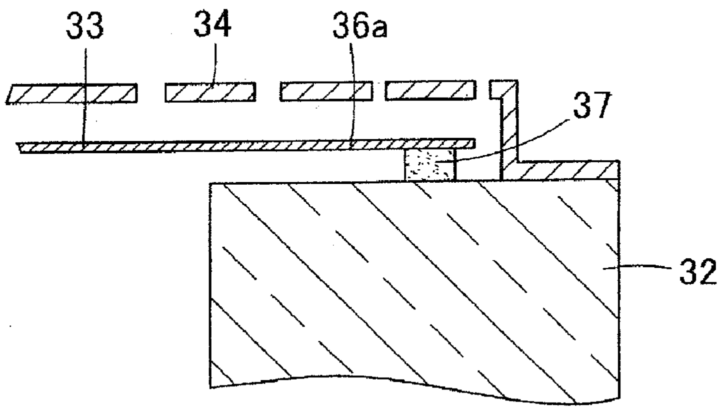
Figure 16C:
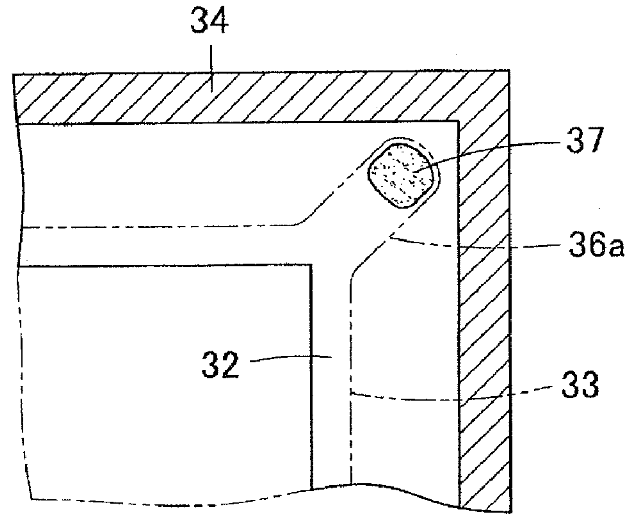

As shown in FIGS. 15B and 15C, the hollow portion 50 is formed in advance in the region excluding the distal end under the beam portion 36*a*, and the etchant is infiltrated into the hollow portion 50 in the etching removing step of the second sacrifice layer 47. As shown with an arrow in the figures, the second sacrifice layer 47 is etched from the hollow portion 50, so that the second sacrifice layer 47 at the lower surface of the distal end of the beam portion 36*a* is rapidly removed by etching and the second sacrifice layer 47 at the lower surface of the distal end of the beam portion 36*a* ultimately remains, as shown in FIG. 16A. As a result, the anchor 37 can be formed at the lower surface of the distal end of the beam portion 36*a* as shown in FIGS. 16B and 16C no matter how long the length of the beam portion 36*a* is made. The position and the size of the anchor 37 can be freely adjusted by adjusting the length of the extended portion 48*a*.

In the manufacturing method described above, the first sacrifice layer 48 is formed (see FIG. 10B) so that the edge and the extended portion 48*a* of the first sacrifice layer 48 overlaps on the second sacrifice layer 47, but an opening 47*a* of the second sacrifice layer 47 may be opened in accordance with the shape of the first sacrifice layer 48, and the first sacrifice layer 48 may be formed to the same thickness so as not to overlap the second sacrifice layer 47 formed the first time. The upper surface of the second sacrifice layer 47 formed the second time thus can be flattened, whereby the diaphragm 33 can be formed flatter.

In the manufacturing method described above, the wet etching by the etchant is used, but the wet etching is not the sole case, and dry etching by semiconductor gas and the like can be selected in view of the etching resistance and the etching characteristics.

(Structure of Second Embodiment)

Figure 17A:
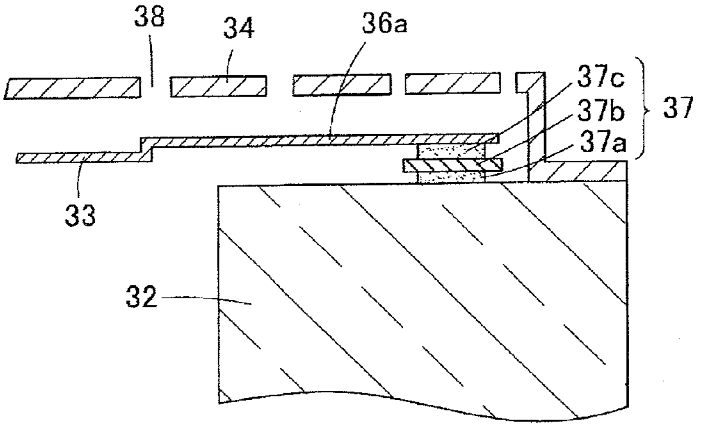
FIG. 17A is a cross-sectional view showing one part of an acoustic sensor according to a second embodiment of the present invention.
Figure 17B:
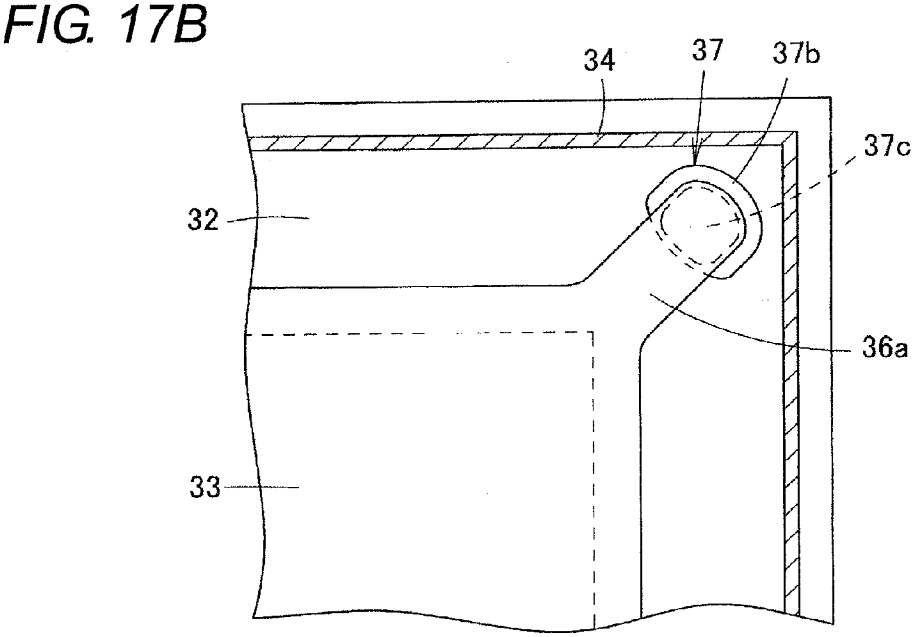
FIG. 17B is a plan view showing one part of the acoustic sensor in a state in which the back plate is removed.

A structure of an acoustic sensor according to a second embodiment of the present invention will now be described. FIG. 17A is a cross-sectional view showing a beam portion structure of the diaphragm 33 according to the second embodiment. FIG. 17B is a plan view of the beam portion in a state in which the back plate is removed.

The anchor 37 has a two-layer structure of the same material (second sacrifice layer 47) in the first embodiment, but the anchor 37 has a multi-layered structure in the second embodiment. In other words, as shown in FIG. 17, the anchor 37 has a three-layer structure of a lower anchor layer 37*a* formed from the second sacrifice layer 47, a middle anchor layer 37*b* formed from the first sacrifice layer 48, and an upper anchor layer 37*c* formed from the second sacrifice layer 47. Therefore, if the deposition thickness of the second sacrifice layer 47 and the first sacrifice layer 48 is the same as the first embodiment, the anchor 37 of the second embodiment becomes higher than the anchor 37 of the first embodiment by the thickness of the middle anchor layer 37*b*.

In the anchor 37 of the second embodiment as well, it is designed so that the middle anchor layer 37*b* has an area greater than the lower anchor layer 37*a* and the upper anchor layer 37*c*. This is to prevent the lower anchor layer 37*a* and the upper anchor layer 37*c* from having an area greater than the middle anchor layer 37*b* due to variation when etching the second sacrifice layer 47, and the anchor 37 from becoming an unstable shape.

Figure 18A:
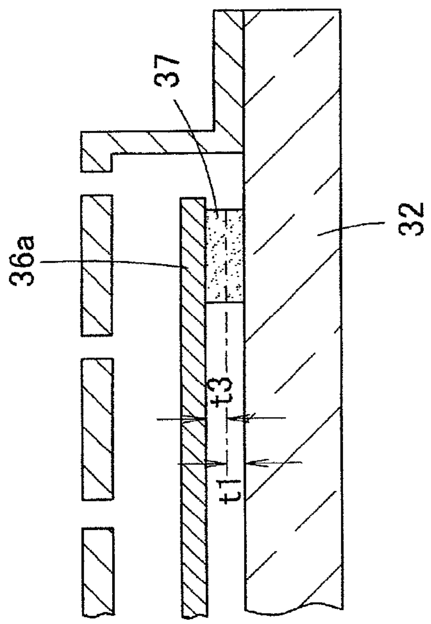
FIG. 18A is a cross-sectional view showing an anchor structure of the first embodiment.
Figure 18B:
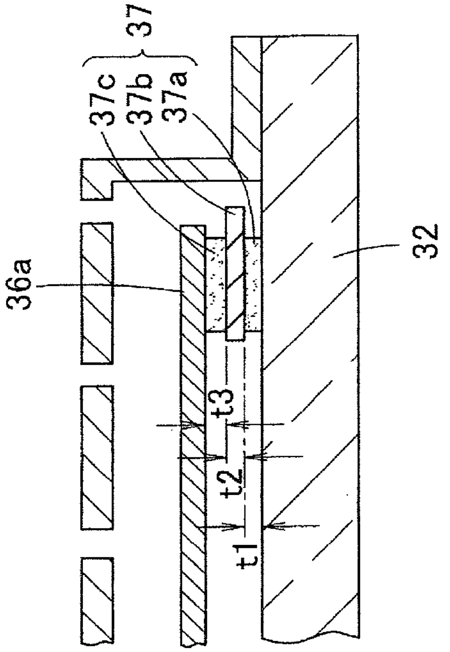
FIG. 18B is a cross-sectional view showing an anchor structure of the second embodiment.

FIGS. 18A and 18B are views describing the characteristics of the second embodiment compared to the first embodiment. FIG. 18A shows the anchor 37 of the two-layer structure in the first embodiment. FIG. 18B shows the anchor 37 of the three-layer structure in the second embodiment. In FIGS. 18A and 18B, the thickness t1 indicates the deposition thickness of the second sacrifice layer 47 formed the first time, the thickness t3 indicates the deposition thickness of the second sacrifice layer 47 formed the second time, and the thickness t2 indicates the deposition thickness of the first sacrifice layer 48.

Assuming the relative permittivity of the second sacrifice layer 47 is ϵ1, the relative permittivity of the first sacrifice layer 48 is ϵ2, the dielectric constant in vacuum is ϵ0, and the area of the anchor 37 is S, the parasitic capacitance C1 in the anchor 37 of the first embodiment of FIG. 18A can be expressed with equation 1.

$$C1 = \varepsilon 0 \frac{S}{\frac{t1}{\varepsilon 1} + \frac{t3}{\varepsilon 1}} \quad \text{[Equation 1]}$$

The parasitic capacitance C2 in the anchor 37 of the second embodiment of FIG. 18B can be expressed with equation 2.

$$C2 = \varepsilon 0 \frac{S}{\frac{t1}{\varepsilon 1} + \frac{t2}{\varepsilon 2} + \frac{t3}{\varepsilon 1}} \quad \text{[Equation 2]}$$

The denominator of equation 2 is greater than the denominator of equation 1, and thus C1>C2. In other words, according to the anchor structure of the second embodiment, the parasitic capacitance of the anchor 37 can be reduced and the lowering in sensitivity of the acoustic sensor due to the parasitic capacitance can be alleviated.

According to the second embodiment, the height of the anchor 37 is higher by the thickness t2 of the middle anchor layer 37*b*, and hence, the distance between the beam portion 36*a* and the surface of the silicon substrate 32 can be made greater than the first embodiment, and the risk of the diaphragm 33 fixedly attaching to the silicon substrate 32 by moisture, static electricity, and the like can be alleviated. Furthermore, microscopic dust is less likely to get stuck between the beam portion 36*a* and the silicon substrate 32.

(Manufacturing Method of Second Embodiment)

Figure 21A:
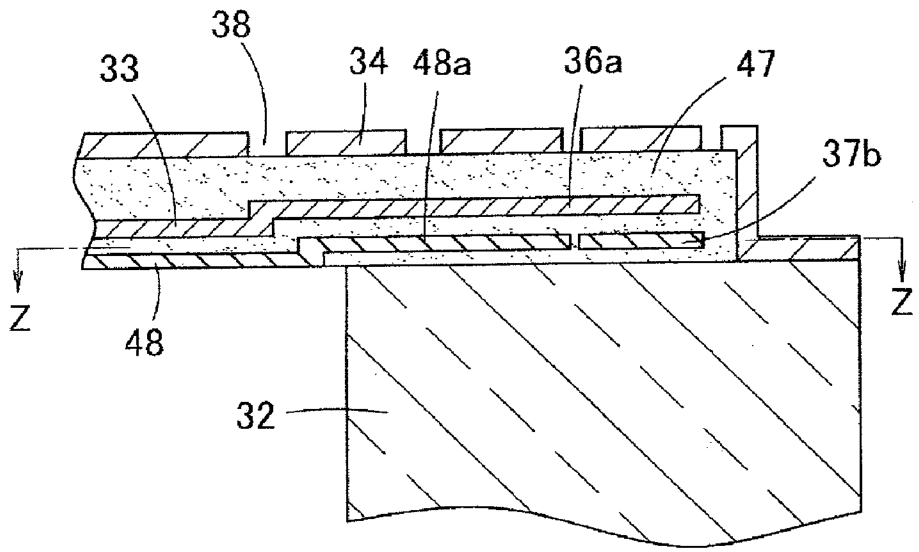
FIG. 21A is a cross-sectional view showing one portion of the acoustic sensor in the process of FIG. 20A in an enlarged manner.
Figure 21B:
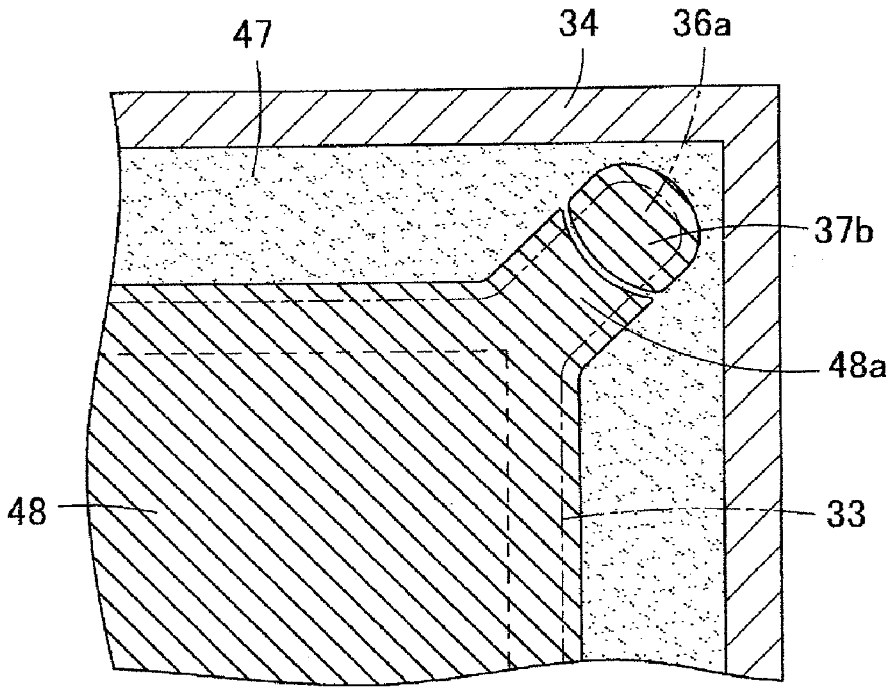
FIG. 21B is a cross-sectional view taken along line Z-Z of FIG. 21A.
Figure 22A:
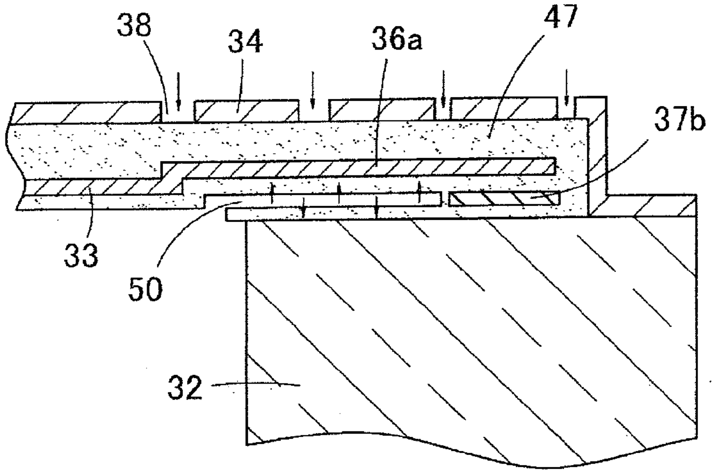
FIG. 22A is a cross-sectional view showing one portion of the acoustic sensor in the process of FIG. 20B in an enlarged manner.
Figure 22B:
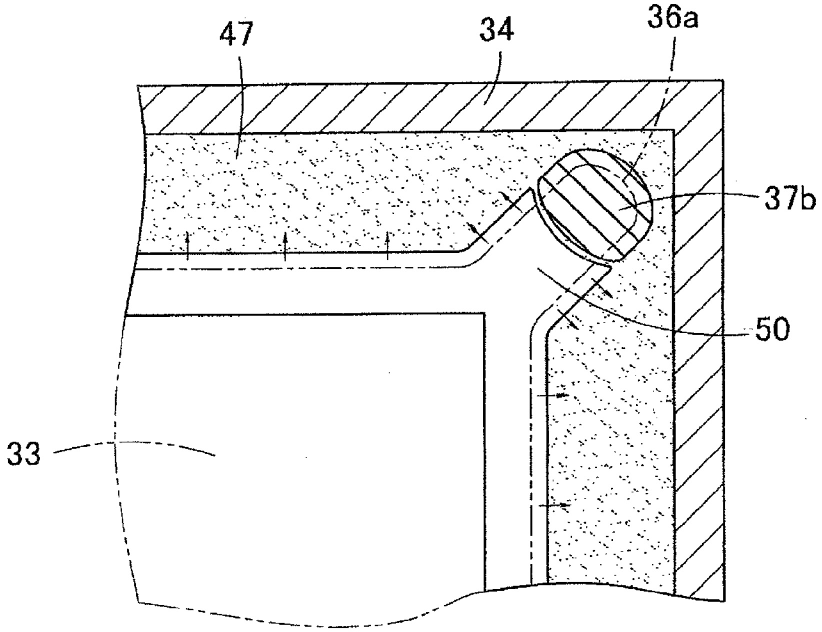
FIG. 22B is a cross-sectional view at a position corresponding to line Z-Z of FIG. 21A in FIG. 22A.

The manufacturing process of an acoustic sensor of a second embodiment will now be described with reference to FIGS. 19 to 22. FIGS. 19A to 19C and FIGS. 20A to 20C are schematic cross-sectional views showing an overall flow of the manufacturing process of the acoustic sensor of the second embodiment. FIG. 21A is a schematic cross-sectional view showing one portion of FIG. 20A in an enlarged manner, and FIG. 21B is a cross-sectional view taken along line Z-Z of FIG. 21A. FIG. 22A is a schematic cross-sectional view showing one portion of FIG. 20B in an enlarged manner, and FIG. 22B is a horizontal cross-sectional view of FIG. 22A at a height corresponding to FIG. 21B.

In the case of the second embodiment, a polysilicon layer is left to form a middle anchor layer 37*b* separate from the extended portion 48*a* (see FIG. 21B) at the tip of the extended portion 48*a*, as shown in FIG. 9A, when arranging the first sacrifice layer 48 made of polysilicon or amorphous silicon on the silicon substrate 32 formed with the second sacrifice layer 47 ($SiO_2$ or SiN).

Figure 19A:
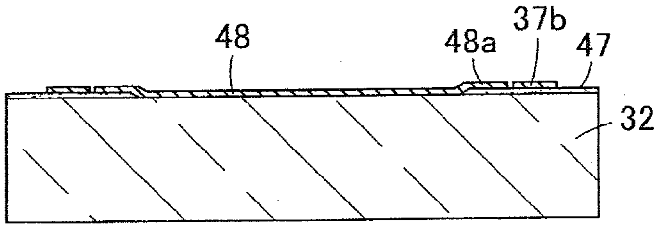
FIGS. 19A to 19C are schematic cross-sectional views describing the manufacturing process of an acoustic sensor of a second embodiment.
Figure 19B:
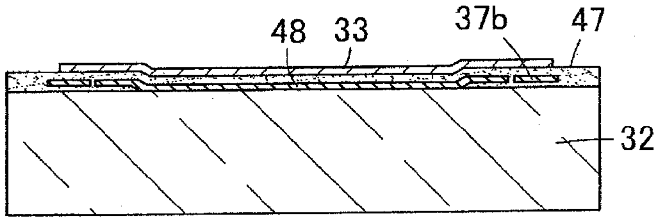
Figure 19C:
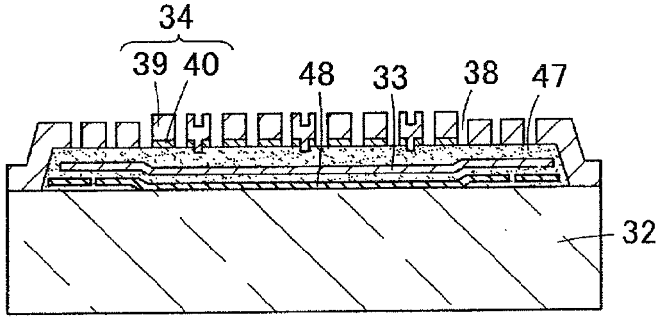

As shown in FIG. 19B, the second sacrifice layer 47 is then deposited on the silicon substrate 32 so as to cover the first sacrifice layer 48 and the middle anchor layer 37*b*, and then the diaphragm 33 is formed by the polysilicon on the second sacrifice layer 47. The second sacrifice layer 47 is patterned to the inner surface shape of the back plate 34, and then the back plate 34 is formed thereon as shown in FIG. 19C.

Figure 20A:
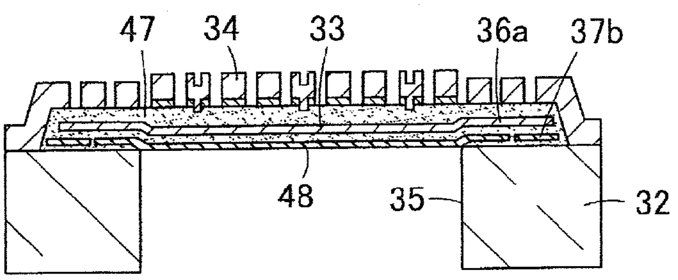
FIGS. 20A to 20C are schematic cross-sectional views describing the manufacturing process of the acoustic sensor of the second embodiment, showing the process following FIG. 19C.
Figure 20B:
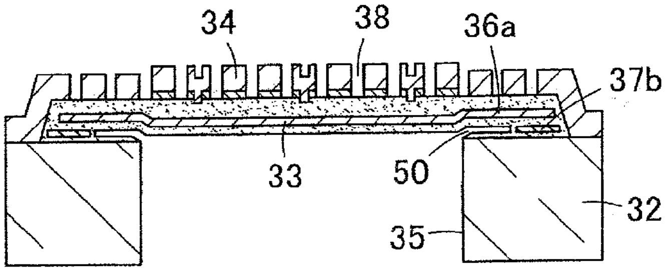

Thereafter, as shown in FIG. 20A, the silicon substrate 32 is dry etched through the DRIE method and the like to vertically form the back chamber 35, and then the first sacrifice layer 48 is selectively removed by etching as shown in FIG. 20B. FIGS. 21A and 21B show the state before the first sacrifice layer 48 is removed by etching, where the middle anchor layer 37*b* is separated from the first sacrifice layer 48 by the second sacrifice layer 47 so that the middle anchor layer 37*b* remains without being etched even if the first sacrifice layer 48 is removed by etching as shown in FIGS. 22A and 22B.

Figure 20C:
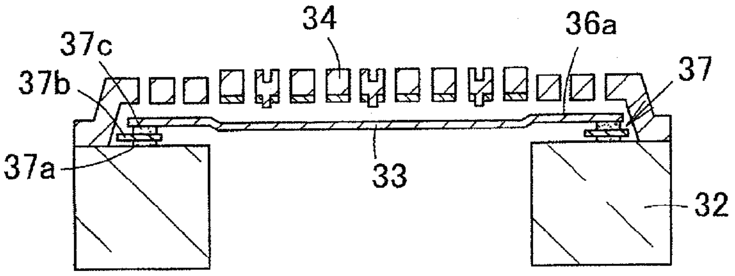

When removing the second sacrifice layer 47 by etching with the etchant infiltrated from the acoustic hole 38 and the hollow portion 50, the second sacrifice layer 47 remains at the distal end of the beam portion 36*a* as shown in FIG. 20C, so that the anchor 37 in which the lower anchor layer 37*a* formed by the second sacrifice layer 47, the middle anchor layer 37*b* made of polysilicon, and the upper anchor layer 37*c* formed by the second sacrifice layer 47 are stacked is formed at the distal end of the beam portion 36*a*.

Figure 23A:
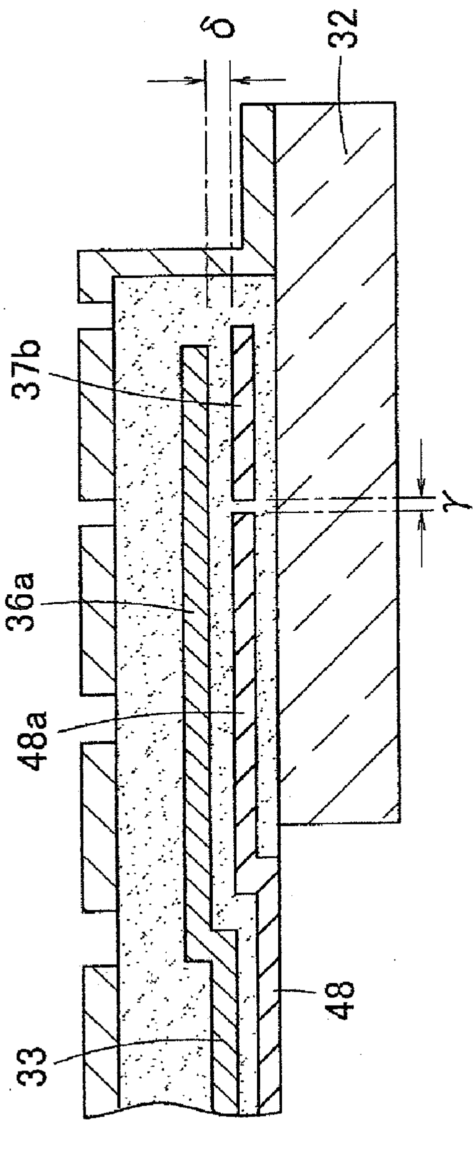
FIGS. 23A and 23B are cross-sectional views showing a beam portion shape of when a void between the end of the first sacrifice layer and the middle anchor layer 37*b* is narrow, and a beam portion shape of when a void between the end of the first sacrifice layer and the middle anchor layer 37*b* is wide.
Figure 23B:
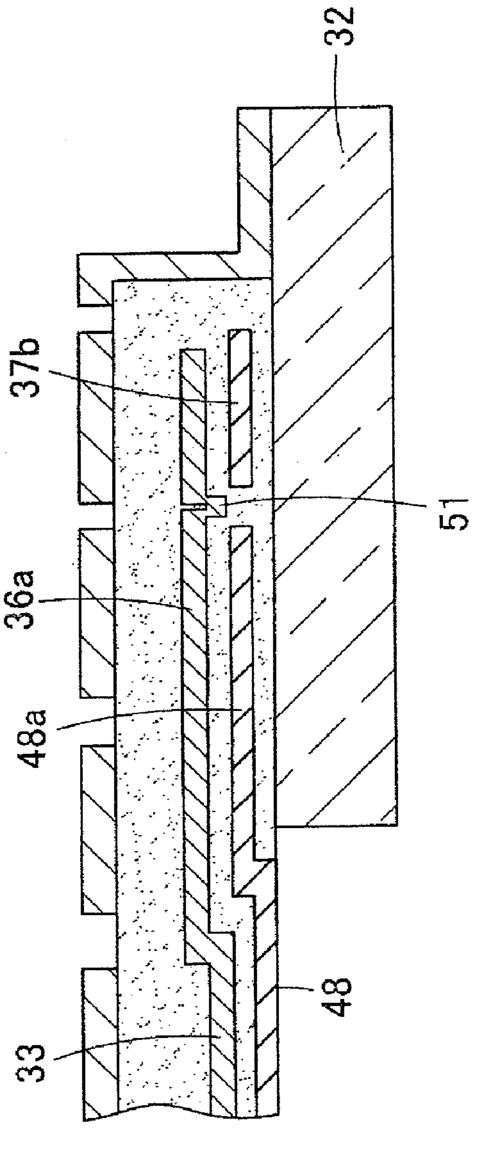

According to one or more embodiments of the present invention, the interval 5 between the extended portion 48*a* and the middle anchor layer 37*b* and the beam portion 36*a* is about 1 μm to a few μm, and hence, the void γ between the extended portion 48*a* and the middle anchor layer 37*b* is also smaller than or equal to a few μm (see FIG. 23A). In other words, if the void γ between the extended portion 48*a* and the middle anchor layer 37*b* is wide, a linear depression forms at the surface of the second sacrifice layer 47 when the second sacrifice layer 47 is formed on the first sacrifice layer 48 (as shown in FIG. 23B) thereby forming a linear bump 51 at the beam portion 36*a*. When such bump 51 forms, stress concentrates at the portion of the bump 51 at the time of vibration of the diaphragm 33, which leads to lowering of the mechanical strength. Therefore, according to one or more embodiments of the present invention, the void γ between the extended portion 48*a* and the middle anchor layer 37*b* is smaller than or equal to 2 μm.

In the acoustic sensor of the second embodiment, a bump does not form between the distal end of the beam portion 36*a* (beam portion 36*a* on the middle anchor layer 37*b*) and the region other than the distal end of the beam portion 36*a* (beam portion 36*a* on the extended portion 48*a*) even if polishing is not carried out through the CMP method or the like because the polysilicon layer (extended portion 48*a* and middle anchor layer 37*b*) is formed over the entire length on the lower side of the beam portion 36*a*. Hence, the beam portion 36*a* can be formed flat over the entire length. Therefore, stress is less likely to concentrate at the beam portion 36*a*, whereby the mechanical strength of the beam portion 36*a* enhances and resistance to drop impact and the like also enhances. In the second embodiment, the bump portion may form on the vibration thin film 36*b* as shown in FIG. 17A if polishing is not carried out through the CMP method or the like, but stress is less likely to concentrate because the bump is not formed on the beam portion 36*a*, whereby the mechanical strength enhances and resistance to drop impact and the like also enhances.

(Variant)

Figure 24A:
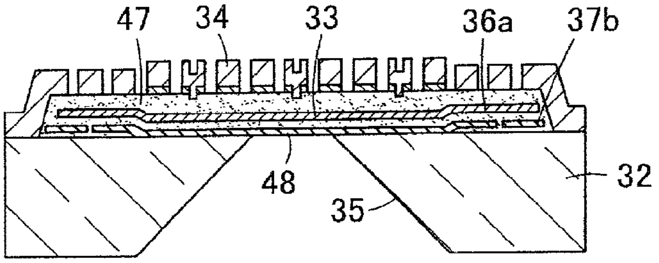
FIGS. 24A to 24C are cross-sectional views describing another manufacturing process of the acoustic sensor of the second embodiment.
Figure 24B:
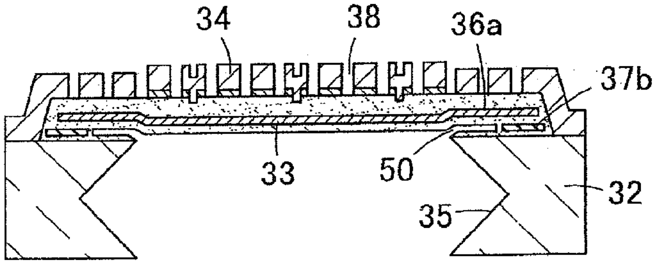
Figure 24C:
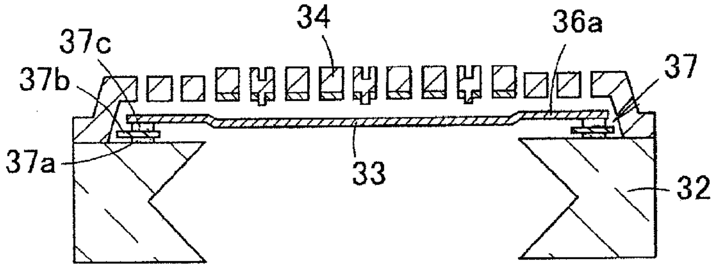

FIGS. 24A to 24C are views describing a variant of the acoustic sensor. In this variant, the silicon substrate 32 is wet etched with a TMAH solution or the like to open the back chamber 35. When the silicon substrate 32 is etched from the rear surface with the TMAH solution or the like, the tapered back chamber 35 is first formed as shown in FIG. 24A, and then the back chamber 35 is formed to a shape in which the central part of the side surface is depressed, as shown in FIG. 24B, if the etching is continued. The acoustic sensor as shown in FIG. 24C is thereby formed, where the volume of the back chamber 35 can be increased to enhance the sensitivity of the acoustic sensor.

Figure 25:
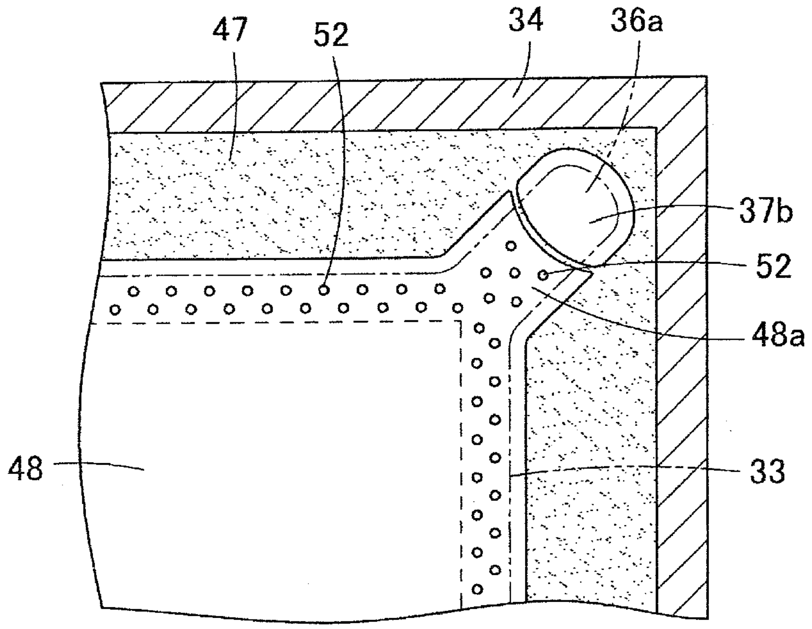
FIG. 25 is a schematic view describing a variant of the second embodiment.
Figure 26A:
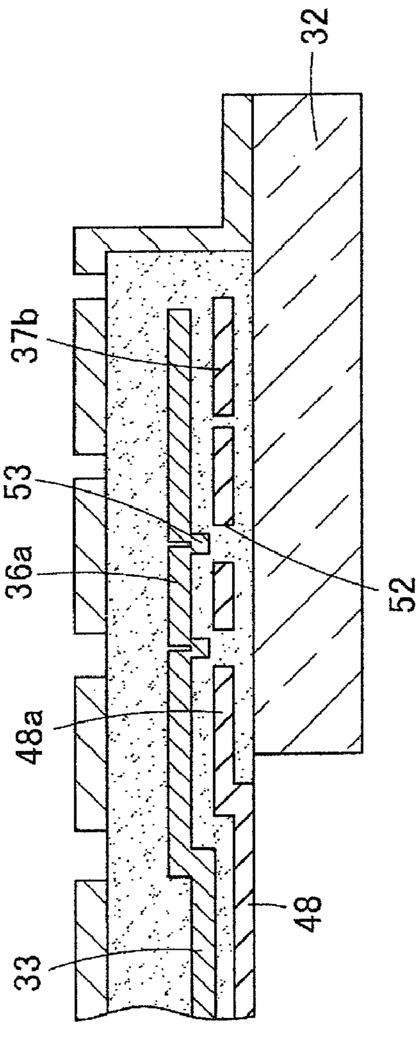
FIGS. 26A and 26B are cross-sectional views describing the variant.
Figure 26B:
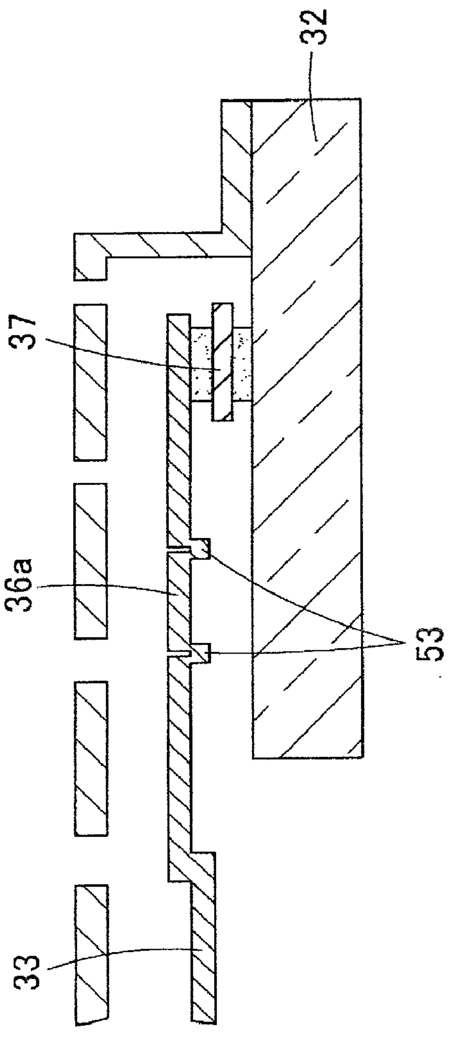

FIG. 25 and FIGS. 26A and 26B show another variant. In this variant, a great number of holes 52 are opened at the edge and the extended portion 48*a* of the first sacrifice layer 48, as shown in FIG. 25 and FIG. 26A. If the hole 52 is opened at the edge and the extended portion 48*a* of the first sacrifice layer 48, the second sacrifice layer 47 deposited thereon depresses roundly, and hence, the projection stopper 53 as shown in FIG. 26B is formed at the lower surface of the diaphragm 33 (edge and the beam portion 36*a* of the vibration thin film 36*b*). When the stopper 53 is brought into contact with the upper surface of the silicon substrate 32, the diaphragm 33 can be prevented from becoming too close to the silicon substrate 32 and the diaphragm 33 can be prevented from being fixedly attached to the silicon substrate 32.

The case of the second embodiment is shown in FIGS. 24 to 26, but such variants can also be applied to the first embodiment.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A manufacturing method of an acoustic sensor,
wherein the acoustic sensor comprises:
a semiconductor substrate with a back chamber;
a vibration thin film arranged on an upper side of the semiconductor substrate;
an anchor arranged on an upper surface of the semiconductor substrate;
a beam portion integrally extended from the vibration thin film and comprising a distal end supported by the anchor; and
a back plate fixed to the upper surface of the semiconductor substrate to cover the vibration thin film and the beam portion with a space,
wherein the acoustic sensor converts an acoustic vibration detected by the vibration thin film into a change in electrostatic capacitance between a fixed electrode film arranged on the back plate and the vibration thin film,
wherein the manufacturing method comprises:
forming a first sacrifice layer and a second sacrifice layer between a surface of the semiconductor substrate and a lower surface of the vibration thin film and the beam portion;
covering an upper surface of the vibration thin film and the beam portion with the second sacrifice layer to arrange the vibration thin film and the beam portion in a sacrifice layer comprising the first sacrifice layer and the second sacrifice layer;
forming the back plate on the sacrifice layer;
forming the back chamber in the semiconductor substrate;
removing the first sacrifice layer by etching; and
removing one part of the second sacrifice layer by etching after removing the first sacrifice layer by etching to form the anchor between a lower surface of the distal end of the beam portion and the surface of the semiconductor substrate from the remaining second sacrifice layer.

2. The manufacturing method of the acoustic sensor according to claim 1, wherein the first sacrifice layer is formed in a region excluding the lower surface of the distal end of the beam portion and other than at least the distal end of the beam portion when seen from a direction perpendicular to the surface of the semiconductor substrate.

3. The manufacturing method of the acoustic sensor according to claim 1, wherein the first sacrifice layer is formed so as not to be in contact with the vibration thin film and the beam portion.

4. The manufacturing method of the acoustic sensor according to claim 1, wherein the first sacrifice layer is formed so as not to be in contact with the semiconductor substrate.

5. The manufacturing method of the acoustic sensor according to claim 1,
wherein the semiconductor substrate is a silicon substrate, and
wherein the first sacrifice layer is polysilicon or amorphous silicon.

6. The manufacturing method of the acoustic sensor according to claim 1,
wherein the semiconductor substrate is a silicon substrate, and
wherein the second sacrifice layer is silicon dioxide film or silicon nitride film.

7. A manufacturing method of an acoustic sensor,
wherein the acoustic sensor comprises:
a semiconductor substrate with a back chamber;
a vibration thin film arranged on an upper side of the semiconductor substrate;
an anchor arranged on an upper surface of the semiconductor substrate;
a beam portion integrally extended from the vibration thin film and comprising a distal end supported by the anchor; and
a back plate fixed to the upper surface of the semiconductor substrate to cover the vibration thin film and the beam portion with a space,
wherein the acoustic sensor converts an acoustic vibration detected by the vibration thin film into a change in electrostatic capacitance between a fixed electrode film arranged on the back plate and the vibration thin film,
wherein the manufacturing method comprises:
forming a first sacrifice layer and a second sacrifice layer between a surface of the semiconductor substrate and a lower surface of the vibration thin film and the beam portion to cover at least one of the lower surface of the beam portion or a region facing the beam portion in the semiconductor substrate with the second sacrifice layer;
forming an anchor layer between the distal end of the beam portion and the semiconductor substrate separate from the first sacrifice layer with the same material as the first sacrifice layer;
covering an upper surface of the vibration thin film and the beam portion with the second sacrifice layer to arrange the vibration thin film and the beam portion in a sacrifice layer comprising the first sacrifice layer and the second sacrifice layer;
forming the back plate on the sacrifice layer;
forming the back chamber in the semiconductor substrate;
removing the first sacrifice layer by etching; and
removing one part of the second sacrifice layer by etching after removing the first sacrifice layer by etching to form the anchor between a lower surface of the distal end of the beam portion and the surface of the semiconductor substrate from the remaining second sacrifice layer and the anchor layer.

8. The manufacturing method of the acoustic sensor according to claim 7, wherein the first sacrifice layer is formed in a region excluding the lower surface of the distal end of the beam portion and other than at least the distal end of the beam portion when seen from a direction perpendicular to the surface of the semiconductor substrate.

9. The manufacturing method of the acoustic sensor according to claim 7,
wherein the semiconductor substrate is a silicon substrate, and
wherein the first sacrifice layer is polysilicon or amorphous silicon.

10. The manufacturing method of the acoustic sensor according to claim 7, wherein the semiconductor substrate is a silicon substrate, and wherein the second sacrifice layer is silicon dioxide film or silicon nitride film.

11. An acoustic sensor comprising:

a semiconductor substrate with a back chamber;

a vibration thin film arranged on an upper side of the semiconductor substrate;

an anchor arranged on an upper surface of the semiconductor substrate;

a beam portion integrally extended from the vibration thin film and comprising a distal end supported by the anchor; and a back plate fixed to the upper surface of the semiconductor substrate to cover the vibration thin film and the beam portion with a space, wherein the acoustic sensor converts an acoustic vibration detected by the vibration thin film into a change in electrostatic capacitance between a fixed electrode film arranged on the back plate and the vibration thin film, and wherein the anchor comprises:

a lower anchor layer made from a non-conductive material arranged on the upper surface of the semiconductor substrate;

an upper anchor layer made from a non-conductive material arranged on the lower surface of the distal end of the beam portion; and a middle anchor layer that is formed from a material different from the upper anchor layer and the lower anchor layer, and that is sandwiched between the upper anchor layer and the lower anchor layer.

12. The acoustic sensor according to claim 11, wherein the semiconductor substrate is a silicon substrate, and wherein the middle anchor layer is polysilicon or amorphous silicon.

13. The acoustic sensor according to claim 11, wherein the semiconductor substrate is a silicon substrate, and wherein the lower anchor layer and the upper anchor layer are silicon dioxide film or silicon nitride film.

* * * * *